US012711893B2

(12) United States Patent
Liu et al.

(10) Patent No.: US 12,711,893 B2
(45) Date of Patent: Aug. 18, 2026

(54) LEVEL SHIFT ASSEMBLY, METHOD FOR OVER-CURRENT PROTECTION, AND DISPLAY APPARATUS

(71) Applicants: Beijing BOE Display Technology Co., Ltd., Beijing (CN); BOE Technology Group Co., Ltd., Beijing (CN)

(72) Inventors: Dong Liu, Beijing (CN); Xibin Shao, Beijing (CN); Hangyu Chen, Beijing (CN); Yinlong Zhang, Beijing (CN); Yanping Liao, Beijing (CN); Jing Zhou, Beijing (CN); Han Zheng, Beijing (CN); Senwang Li, Beijing (CN); Liugang Zhou, Beijing (CN); Wenpeng Ma, Beijing (CN); Dongchuan Chen, Beijing (CN); Jiantao Liu, Beijing (CN)

(73) Assignees: BEIJING BOE DISPLAY TECHNOLOGY CO., LTD., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 259 days.

(21) Appl. No.: 18/716,921

(22) PCT Filed: Aug. 31, 2023

(86) PCT No.: PCT/CN2023/116315

§ 371 (c)(1),
(2) Date: Jun. 5, 2024

(87) PCT Pub. No.: WO2025/043653

PCT Pub. Date: Mar. 6, 2025

(65) Prior Publication Data

US 2026/0155080 A1 Jun. 4, 2026

(51) Int. Cl.
*G09G 3/20* (2006.01)
*H03K 19/003* (2006.01)
*H03K 19/0175* (2006.01)

(52) U.S. Cl.
CPC ......... *G09G 3/2092* (2013.01); *H03K 19/003* (2013.01); *H03K 19/017509* (2013.01);
(Continued)

(58) Field of Classification Search
None
See application file for complete search history.

(56) References Cited

U.S. PATENT DOCUMENTS

2019/0028103 A1* 1/2019 Zhang .................. H02H 3/0935
2020/0327859 A1 10/2020 Uchiyama

FOREIGN PATENT DOCUMENTS

CN 106057142 A 10/2016
CN 107452320 A 12/2017

(Continued)

*Primary Examiner* — Ifedayo B Iluyomade
(74) *Attorney, Agent, or Firm* — XSENSUS LLP

(57) ABSTRACT

A level shift assembly, a method for over-current protection, and a display apparatus. The level shift assembly includes a level shift module, which includes a control unit, a current detection unit, a level shift unit, and an over-current protection unit. The controller determines, at a first falling edge of a digital clock signal, a first analog clock signal among a plurality of analog clock signals which corresponds to the first falling edge based on a correspondence of a current display mode; the current detection unit detects a current of the first analog clock signal; and a moment, at which a falling edge of the digital clock signal is present, is within a last line of a corresponding analog clock signal, and an over-current signal is sent to the over-current protection unit when the current of the first analog clock signal is not within a current threshold range.

20 Claims, 14 Drawing Sheets

(52) U.S. Cl.
CPC ............... *G09G 2310/0286* (2013.01); *G09G 2310/0289* (2013.01); *G09G 2310/08* (2013.01); *G09G 2320/06* (2013.01); *G09G 2330/04* (2013.01); *G09G 2340/0435* (2013.01)

(56) References Cited

FOREIGN PATENT DOCUMENTS

| | | | |
|---|---|---|---|
| CN | 107527602 | A | 12/2017 |
| CN | 107742493 | A | 2/2018 |
| CN | 109119015 | A | 1/2019 |
| CN | 109509415 | A | 3/2019 |
| CN | 110060644 | A | 7/2019 |
| CN | 111161664 | A | 5/2020 |
| CN | 115775521 | A | 3/2023 |

* cited by examiner

CPV1
STV
CLK1
CLK2
CLK3
CLK4
CLK5
CLK6
CLK7
CLK8

LEVEL SHIFT ASSEMBLY, METHOD FOR OVER-CURRENT PROTECTION, AND DISPLAY APPARATUS

CROSS-REFERENCE TO RELATED APPLICATION

The present application is a National Stage of International Application No. PCT/CN2023/116315 filed on Aug. 31, 2023, the contents of which are incorporated herein by reference in their entirety.

TECHNICAL FIELD

The present disclosure relates to the field of display technologies, and in particular, to a level shift assembly, a method for over-current protection, and a display apparatus.

BACKGROUND OF THE INVENTION

A level shift assembly is a component in a display apparatus and is for use in level shifting of a clock signal, such that a display panel in the display apparatus can be driven for displaying.

The level shift assembly includes a level shift module and an over-current protection module; the level shift module is configured to implement level shifting; and the over-current protection module is configured to monitor the current of each circuit in the level shift assembly in real time, determine the occurrence of over-current when the current is greater than a preset threshold, and then perform an over-current protection operation (such as power-off or other operations).

However, when the level shift assembly operates normally, the current in some circuits may also exceed the preset threshold, resulting in low accuracy of the above-mentioned level shift assembly for over-current detection.

SUMMARY OF THE INVENTION

Embodiments of the present disclosure provide a level shift assembly, a method for over-current protection, and a display apparatus. The technical solutions are as follows.

According to a first aspect of the present disclosure, a level shift assembly for use in a display apparatus is provided. The level shift assembly includes a level shift module, wherein the level shift module includes a control unit, a current detection unit, a level shift unit, and an over-current protection unit;

the level shift unit is configured to acquire a digital clock signal and acquire a plurality of analog clock signals based on the digital clock signal;

the control unit is configured to determine, at a first falling edge of the digital clock signal, a first analog clock signal among the analog clock signals which corresponds to the first falling edge based on a correspondence of a current display mode, wherein the correspondence includes an analog clock signal among the analog clock signals which corresponds to a falling edge of the digital clock signal, and a moment, at which the falling edge of the digital clock signal is present, is within a last line in one of a high-level period and a low-level period of a corresponding analog clock signal;

the control unit is configured to control the current detection unit to detect a current of the first analog clock signal; and the current detection unit is configured to send an over-current signal to the over-current protection unit when the current of the first analog clock signal is not within a current threshold range.

Optionally, the level shift module further includes a falling edge trigger, which is configured to monitor the digital clock signal and send a falling edge signal to the control unit when the falling edge of the digital clock signal is detected.

Optionally, the control unit includes a shift register, which is electrically connected to the falling edge trigger and is configured to control, under trigger of the falling edge signal and based on the correspondence, the current detection unit to detect a current of the analog clock signal corresponding to the falling edge.

Optionally, the control unit further includes a controller and a shift matrix circuit electrically connected to the shift matrix circuit;

the shift matrix circuit is electrically connected to the shift register and the current detection unit, respectively;

the current detection unit includes a plurality of current detection subunits, which are configured to detect currents of the plurality of analog clock signals, respectively; and the controller is configured to control the shift matrix circuit to switch on a connection between the shift register and a first current detection subunit among the current detection subunits at the first falling edge, and the first current detection subunit is configured to detect the current of the first analog clock signal under control of the shift register.

Optionally, each of the current detection subunits includes a switch sub-subunit and a current detection sub-subunit, and the switch sub-subunit is electrically connected to the current detection sub-subunit and is electrically connected to the shift matrix circuit; and the shift register is configured to send an switch-on signal to the shift matrix circuit when receiving the falling edge signal, in order that the shift matrix circuit transmits the switch-on signal to a switch sub-subunit in the first current detection subunit, and the switch sub-subunit is configured to turn on a current detection sub-subunit in the first current detection subunit.

Optionally, the level shift module further includes a memory, clock signal data being stored in the memory; the clock signal data include data of the plurality of analog clock signals and data of the digital clock signal; the memory is electrically connected to the controller; the controller is configured to control the shift matrix circuit based on the clock signal data, such that the shift matrix circuit switch on the connection between the shift register and the first current detection subunit among the current detection subunits at the first falling edge.

Optionally, the clock signal data include a number of cycles of the analog clock signals, and the controller is configured to control the shift register based on the number of cycles of the plurality of analog clock signals, such that a number of bits of the shift register is the same as the number of cycles of the analog clock signals.

Optionally, the shift matrix circuit includes a plurality of input channels and a plurality of output channels, the plurality of input channels being electrically connected to the shift register, and the plurality of output channels being electrically connected to the plurality of current detection subunits;

the controller is further configured to determine, among a plurality of preset display modes, a target display mode matching the current display mode, the plurality of preset display modes each having a corresponding correspondence, which includes connecting relationships between the plurality of input channels and the plurality of output channels; and the controller is further configured to control the shift matrix circuit based on the corresponding correspondence of the target display mode.

Optionally, the display apparatus includes a frame start signal line, and the level shift module further includes a reset unit, which is electrically connected to the frame start signal line and the shift register, respectively; and the reset unit is configured to reset the shift register when receiving a frame start signal from the frame start signal line.

Optionally, the reset unit includes a rising edge trigger and a reset switch; the rising edge trigger is electrically connected to the frame start signal line and the reset switch, respectively; and the reset switch is electrically connected to the shift register.

Optionally, the display apparatus includes at least two digital clock signal lines; the control unit has a number of at least two; and the at least two control units are electrically connected to the at least two digital clock signal lines in one-to-one correspondence.

Optionally, the display apparatus includes one digital clock signal line; the control unit has a number of one; and the control unit is electrically connected to the one digital clock signal line.

Optionally, the digital clock signal includes a first digital clock signal and a second digital clock signal; the level shift unit is configured to acquire, based on the first digital clock signal and the second digital clock signal, the plurality of analog clock signals arranged sequentially; and for any two adjacent analog clock signals among the analog clock signals, a latter analog clock signal lags one line behind a previous analog clock signal.

Optionally, the level shift module has a number of 2, the two level shift modules including a first level shift module and a second level shift module, the first level shift module and the second level shift module are configured to jointly generate n analog clock signals, and for any two adjacent analog clock signals of the n analog clock signals, a latter analog clock signal lags one line behind a previous analog clock signal;

a level shift unit in the first level shift module is configured to acquire a first digital clock signal and a second digital clock signal, and generates odd-numbered analog clock signals among the n analog clock signals based on the first digital clock signal and the second digital clock signal;

a level shift unit in the second level shift unit is configured to acquire a third digital clock signal and a fourth digital clock signal, and generates even-numbered analog clock signals among the n analog clock signals based on the third digital clock signal and the fourth digital clock signal; and the first digital clock signal, the second digital clock signal, the third digital clock signal and the fourth digital clock signal each have a duty cycle greater than 50%.

Optionally, the level shift module has a number of 2, the two level shift modules including a first level shift module and a second level shift module, the first level shift module and the second level shift module are configured to jointly generate n analog clock signals, the n analog clock signals include a plurality of analog clock signal sets, each of which includes two adjacent analog clock signals, and for any two adjacent analog clock signal sets, a latter analog clock signal set lags one line behind a previous analog clock signal set;

a level shift unit in the first level shift module is configured to acquire a first digital clock signal and a second digital clock signal, and generates odd-numbered analog clock signals among the n analog clock signals based on the first digital clock signal and the second digital clock signal;

a level shift unit in the second level shift module is configured to acquire a third digital clock signal and a fourth digital clock signal, and generate even-numbered analog clock signals among the n analog clock signals based on the third digital clock signal and the fourth digital clock signal.

Optionally, the digital clock signal includes a first digital clock signal; the level shift unit is configured to acquire, based on the first digital clock signal, the plurality of analog clock signals arranged sequentially; and for any two adjacent analog clock signals among the analog clock signals, a latter analog clock signal lags one line behind a previous analog clock signal.

Optionally, the display apparatus includes a drive circuit, which is configured to acquire the plurality of analog clock signals output by the level shift unit and to drive, based on the plurality of analog clock signals, the display apparatus to display; and the over-current protection unit is configured to determine, when the over-current signal is received, whether over-current occurs based on the over-current signal.

According to another aspect of the embodiments of the present disclosure, a method for over-current protection for use in the level shift assembly defined above is provided. The method includes:

acquiring a digital clock signal and acquiring a plurality of analog clock signals based on the digital clock signal;

determining, at a first falling edge of the digital clock signal, a first analog clock signal among the analog clock signals which corresponds to the first falling edge based on a correspondence, wherein the correspondence includes an analog clock signal among the analog clock signals which corresponds to a falling edge of the digital clock signal, and a moment, at which the falling edge of the digital clock signal is present, is within a last line in one of a high-level period and a low-level period of a corresponding analog clock signal;

detecting a current of the first analog clock signal; and performing over-current protective detection when the current of the first analog clock signal is not within a current threshold range.

Optionally, performing the over-current protection includes:

determining whether a preset number of analog clock signals having currents not within the current threshold range are present among the plurality of analog clock signals; and determining that the over-current has occurred when the preset number of analog clock signals having currents not within the current threshold range are present among the plurality of analog clock signals.

According to another aspect of the embodiments of the present disclosure, a display apparatus is provided. The display apparatus includes a display panel and the level shift assembly defined above.

Optionally, the display apparatus further includes a timing controller and a drive circuit, wherein the level shift assembly is electrically connected to the timing controller and the drive circuit, respectively; the timing controller is configured to provide a digital clock signal to the level shift assembly; and the drive circuit is configured to drive the display panel based on analog clock signals provided by the level shift assembly.

BRIEF DESCRIPTION OF DRAWINGS

For clearer descriptions of the technical solutions in the embodiments of the present disclosure, the following briefly introduces the accompanying drawings required for describing the embodiments. Apparently, the accompanying drawings in the following description show merely some embodiments of the present disclosure, and persons of ordinary skill in the art may still derive other drawings from these accompanying drawings without creative efforts.

The embodiments of the present disclosure have been illustrated explicitly through the drawings above, and will be described in further detail hereinafter. These drawings and text descriptions are not intended to limit the scope of the inventive conception in any way, but to explain the concept of the present disclosure to persons of skills in the art with reference to specific embodiments.

DETAILED DESCRIPTION

To describe the objectives, technical solutions, and advantages of the present disclosure more clearly, the embodiments of the present disclosure are further described in detail hereinafter in conjunction with the accompanying drawings.

Figure 1:
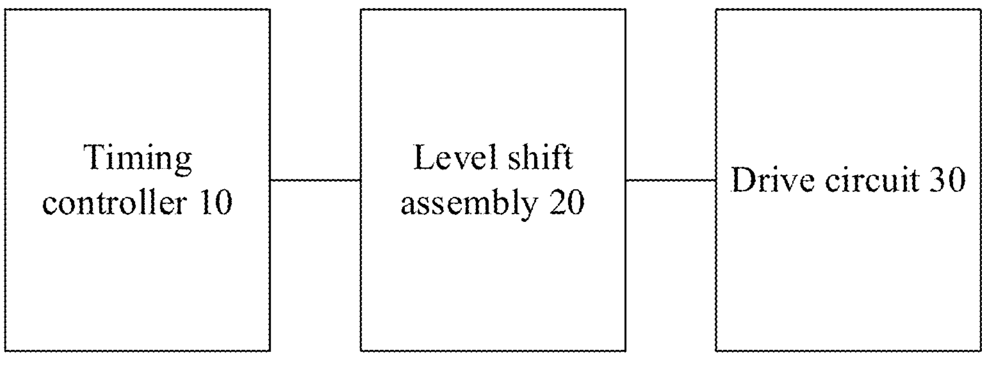
FIG. 1 is a schematic structural diagram of a part of a display apparatus according to an embodiment of the present disclosure.

FIG. 1 is a schematic structural diagram of a part of a display apparatus according to an embodiment of the present disclosure. In FIG. 1, a timing controller 10, a level shift assembly 20, and a drive circuit 30 may be included.

The level shift assembly 20 may be electrically connected to the timing controller (TCON) 10 and the drive circuit 30 respectively. The level shift assembly 20 may include a level shift integrated circuit (IC). The timing controller 10 may input a digital clock signal (CPV) to the level shift assembly 20; the level shift assembly 20 may generate a plurality of analog clock signals (CLKs) based on the digital clock signal, and input the plurality of analog clock signals into the drive circuit 30; and the drive circuit 30 may drive, based on the plurality of analog clock signals, a display panel in the display apparatus for displaying. The drive circuit 30 may be a gate drive circuit or some other drive circuits, and the drive circuit 30 may be disposed outside or inside the display panel.

Figure 2:
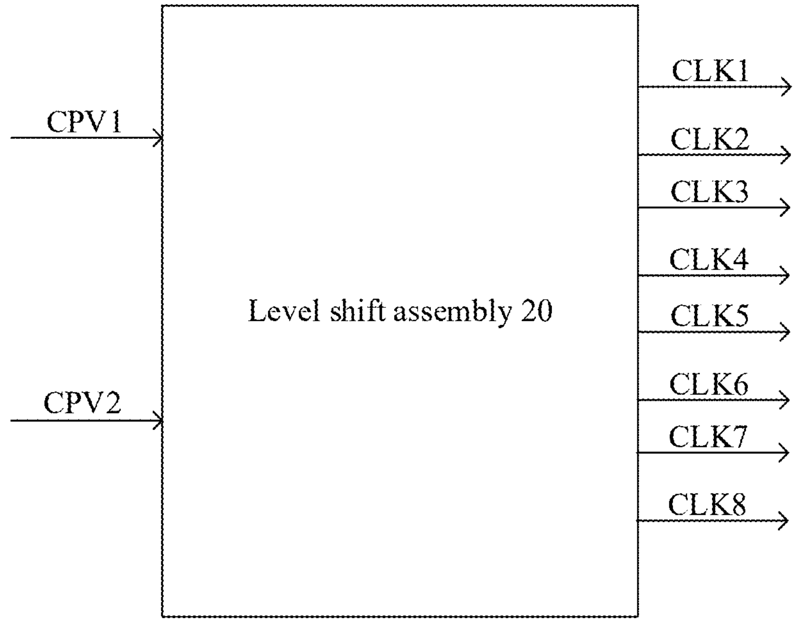
FIG. 2 is a schematic diagram of a level shift assembly shown in FIG. 1.
Figure 3:
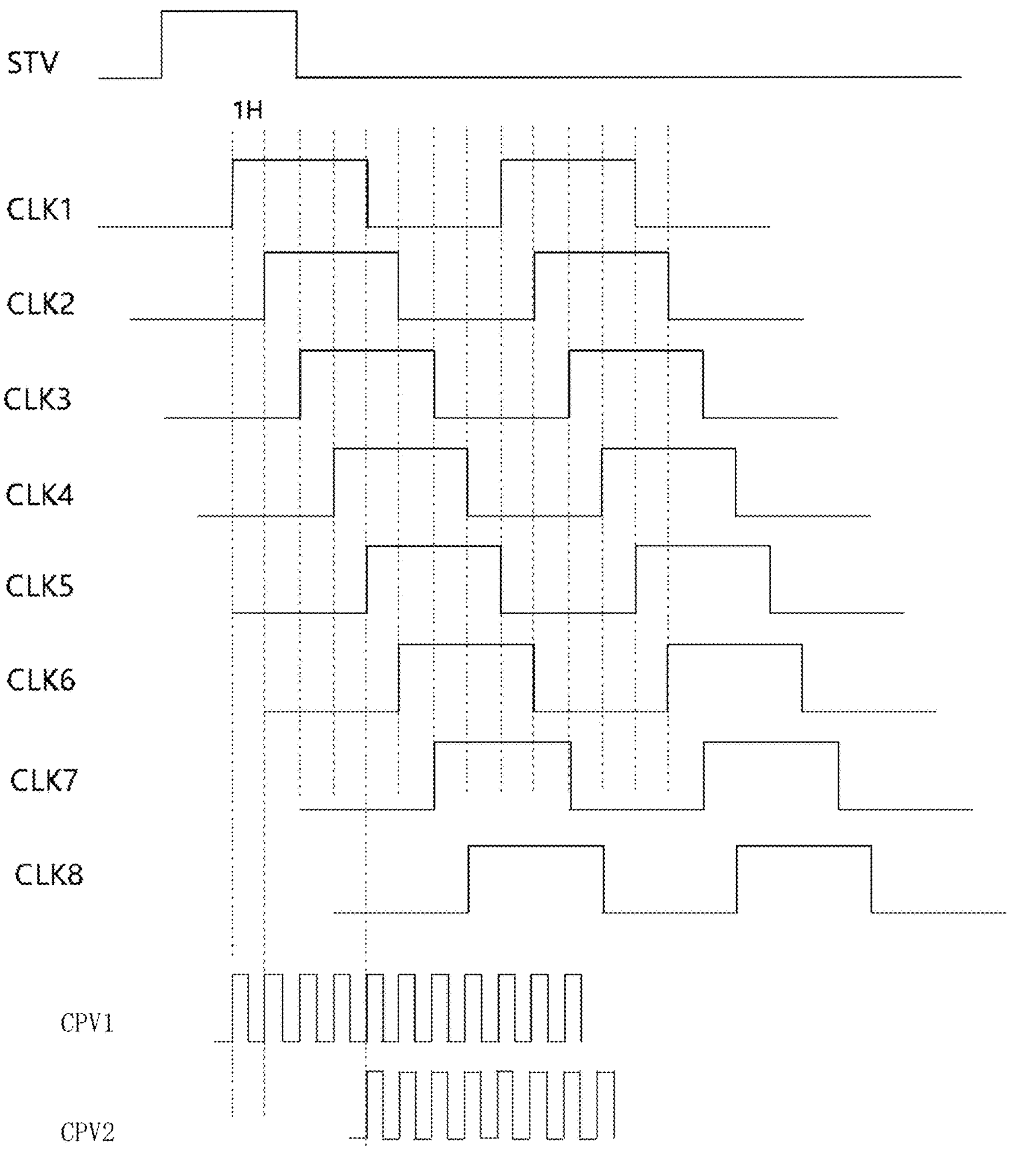
FIG. 3 is a schematic diagram of the generation of analog clock signals by the level shift assembly shown in FIG. 2 based on a digital clock signal.

FIG. 2 is a schematic diagram of the level shift assembly shown in FIG. 1, and FIG. 3 is a schematic diagram of the generation of analog clock signals by the level shift assembly shown in FIG. 2 based on digital clock signals (in FIG. 3, a transverse direction may represent time and a longitudinal direction may represent voltage). Referring to FIG. 2 and FIG. 3, the level shift assembly 20 receives two digital clock signals CPV1 and CPV2, and may generate a plurality of analog clock signals based on these two digital clock signals CPV1 and CPV2 (FIG. 2 shows 8 analog clock signals CLK1-CLK8, which, however, is not limited in the embodiments of the present disclosure). Specifically, the level shift assembly 20 may control the rising edges of the analog clock signals based on each rising edge of the digital clock signal CPV1, and control the falling edges of the analog clock signals based on each rising edge of the digital clock signal CPV2.

For example, the level shift assembly 20 may generate the first rising edge of CLK1 at the first rising edge of the digital clock signal CPV1, generate the first rising edge of CLK2 at the second rising edge of the digital clock signal CPV1, and so on to generate the rising edges of eight CLKs. Correspondingly, the level shift assembly 20 may generate the first falling edge of CLK1 at the first rising edge of the digital clock signal CPV2, generate the first falling edge of CLK2 at the second rising edge of the digital clock signal CPV2, and so on to generate the falling edges of eight CLKs.

It should be noted that, in each CLK, a period, during which the level is high, after the rising edge and before the falling edge may be called a high-level period; a period, during which the level is low, after the falling edge and before the rising edge may be called a low-level period; and each CLK may include a plurality of high-level periods and low-level periods that are arranged alternately, and one high-level period and its one adjacent low-level period may be called one CLK cycle; and each CLK cycle may be divided into a plurality of lines (1H as a line shown in FIG. 3), and one of the plurality of lines in each CLK cycle may correspond to one sub-pixel line in the display panel. Moreover, each CLK cycle may include m lines of high level and n lines of low level, and m+n is equal to the number of CLKs, for example, in case of 8 CLKs, then m+n=8. FIG. 3 shows the case of m=4, n=4, and m+n=8.

In addition, the lines of the analog clock signals involved in the embodiments of the present disclosure may include lines in a space domain (referred to as space-domain lines) and lines in a moment domain (referred to as time-domain lines). The line in the space domain may be 1H in FIG. 3 and may correspond to one sub-pixel line; and the line in a moment domain may refer to the difference value between the adjacent analog clock signals in a moment domain. For example, in FIG. 3, the adjacent analog clock signals differ by one space-domain line in a moment domain, and in this case, a moment-domain line is in one-to-one correspondence to the space-domain line. Without doubt, one time-domain line may also correspond to two or more space-domain lines. In an embodiment of the present disclosure, a line may refer to a moment-domain line, unless otherwise specified.

Figure 4:
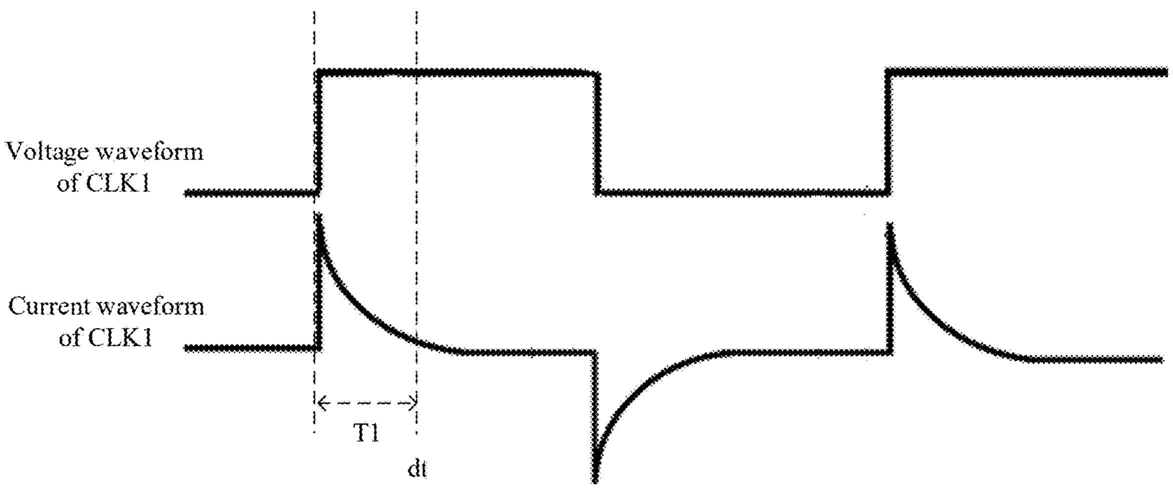
FIG. 4 is a schematic diagram of the voltage and current of some circuits in the schematic diagram shown in FIG. 2.

FIG. 4 is a schematic diagram of the voltage and current of some circuits in the schematic diagram shown in FIG. 2. Referring to FIG. 4, when the circuit where the digital clock signal CLK1 is present does not have problems such as short circuit, starting from the rising edge of CLK1, the circuit where CLK1 is present generates current due to voltage jumps, the magnitude of current may be determined by the resistance and capacitance of the circuit where CLK1 is present, and the current will attenuate rapidly. In some existing level shift groups, a detection time dt is determined in a CLK cycle; whether the current is greater than a threshold at a moment of dt is detected; and based on this, whether to perform an over-current protection operation is determined. The detection time dt may be a moment that is after the rising edge and is away from the rising edge by a preset duration T1.

However, this is problematic in two aspects.

In one aspect, the accuracy of the detection time dt is difficult to guarantee. The current accuracy of the detection time dt is ±20%, which may lead to large errors and then lead to misjudgment. For example, when two adjacent CLKs are short-circuited, the short-circuit current generated only exists in one line period, and thus, the preset duration T1 should be set to be less than one line period to ensure that the short circuit is detectable. Furthermore, the line period is decreasing with the demand for high resolution and high refresh rate. For example, the line period for 4 K 120 Hz is 3.7 us, and the line period for 4 K 240 Hz and 8 K 120 Hz is 1.85 us. In other words, the preset duration T1 should also be increasingly smaller.

When the preset duration T1 is set to be relatively small, in the case of CLK short circuit, the CLK current includes two parts, namely the normal current which is generated by the CLK voltage jump and which then gradually decreases generally to zero within 2 microseconds, and the short-circuit current. If the preset duration T1 is set unreasonably, the detection time dt may be caused to fall within the period during which the normal current attenuates. Then, the fluctuation of the preset duration T1 caused by the error leads to the increased fluctuation range of a current value detected at the detection time dt, which easily leads to false trigger or no trigger. Furthermore, improving the accuracy of the detection time dt greatly increases the cost of the level shift ICs.

Figure 5:
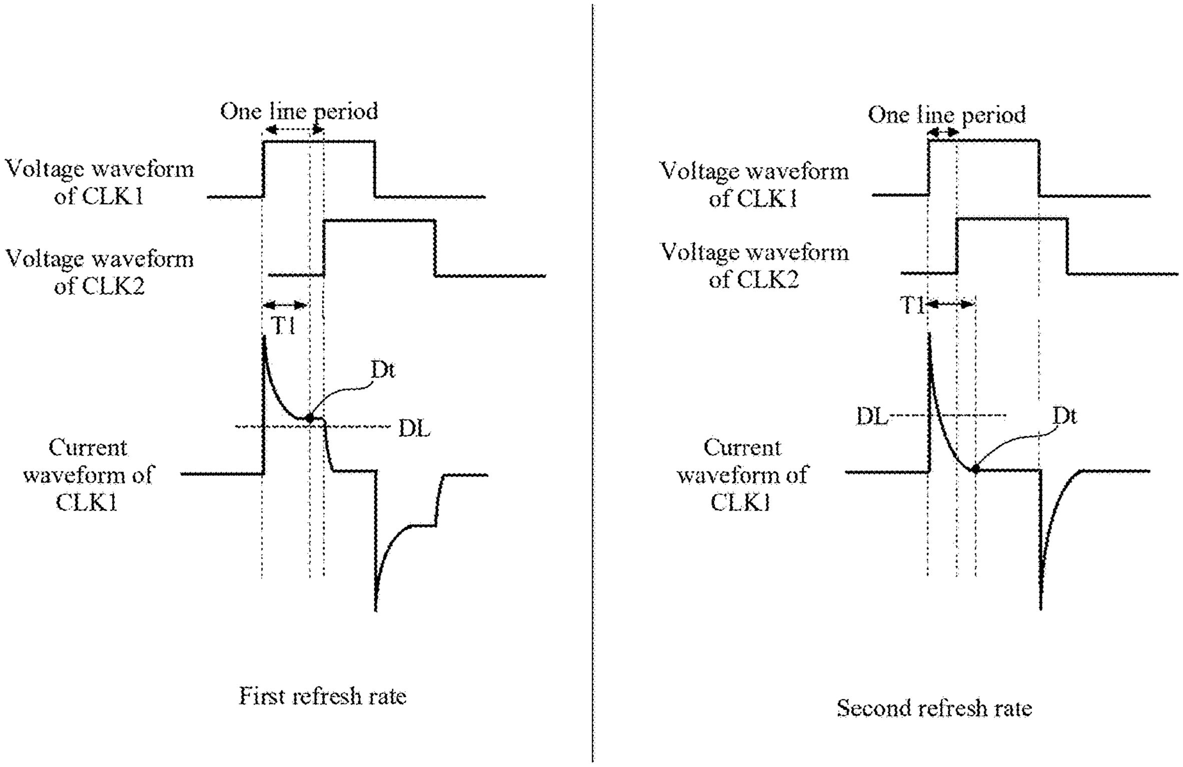
FIG. 5 is a schematic diagram of the voltage and current at different refresh rates.

In another aspect, when one line period of CLK changes, for example, when the whole machine mode is switched from a 60 Hz refresh mode to a 120 Hz refresh mode to change one line period of CLK from 7.4 us to 3.7 us, if the preset duration T1 is set according to 60 Hz, partial short circuit and large current may occur after the mode is switched to 120 Hz, such that the protection cannot be triggered. As shown in FIG. 5 below, FIG. 5 is a schematic diagram of the voltage and current at different refresh rates, with a first refresh rate that may be 60 Hz and a second refresh rate that may be 120 Hz. If the preset duration T1 is the same at the two refresh rates, the current detected at the detection time dt at the first refresh rate may be greater than the threshold DL, and the current detected at the detection time dt at the second refresh rate may be less than the threshold DL. As such, the problem of false trigger may occur.

The level shift assembly according to the embodiment of the present disclosure may solve some problems existing in the related art.

Figures 6, 7:
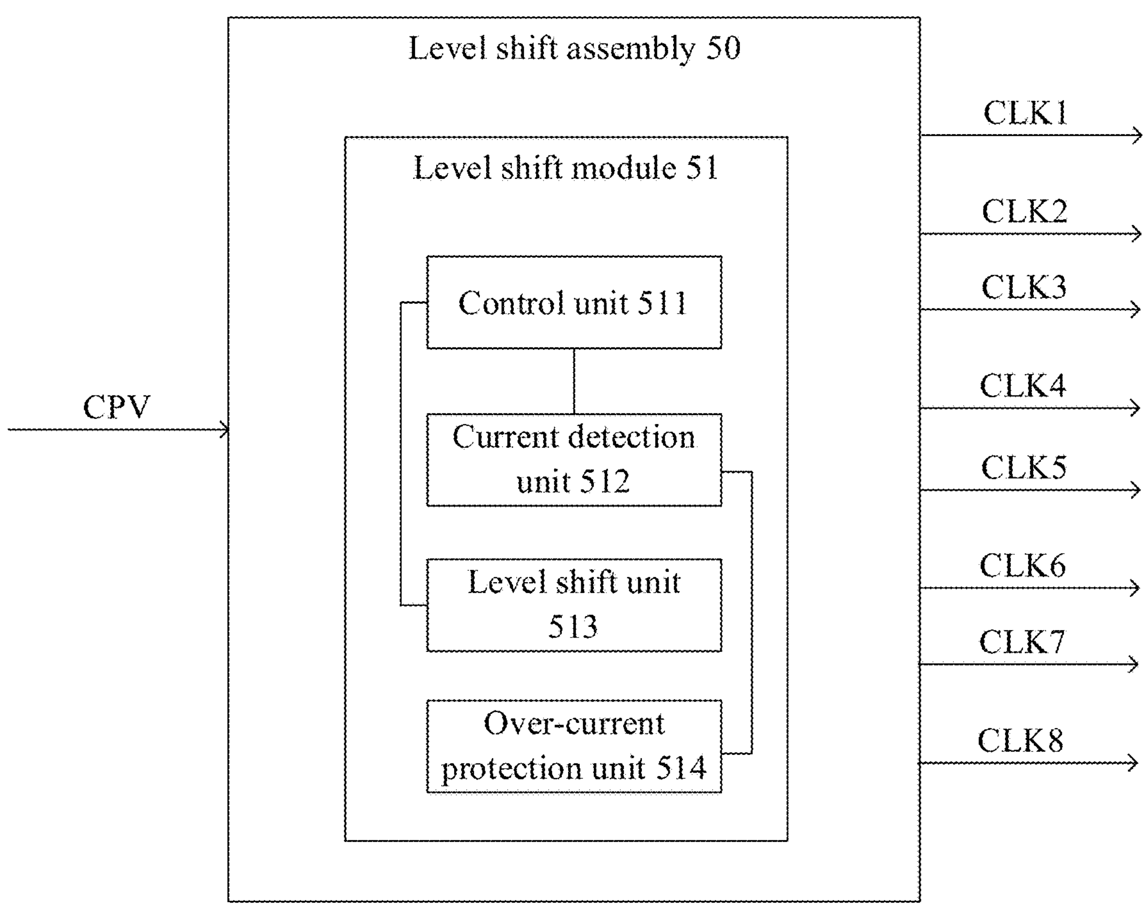
FIG. 6 is a schematic structural diagram of a level shift assembly according to an embodiment of the present disclosure.
FIG. 7 is a schematic diagram of a digital clock signal and analog clock signals of the level shift assembly shown in FIG. 6.

FIG. 6 is a schematic structural diagram of a level shift assembly according to an embodiment of the present disclosure. The level shift assembly is for use in a display apparatus. The level shift assembly 50 may include a level shift module 51, which may include a control unit 511, a current detection unit 512, a level shift unit 513, and an over-current protection unit 514.

The level shift unit 513 is configured to acquire a digital clock signal CPV and acquire a plurality of analog clock signals based on the digital clock signal CPV (FIG. 6 shows the case where the analog clock signals include CLK1-CLK8, which, however, is not limited thereto).

The control unit 511 is configured to determine, at a first falling edge of the digital clock signal, a first analog clock signal among the analog clock signals which corresponds to the first falling edge based on a correspondence of a current display mode. The correspondence includes an analog clock signal among the analog clock signals which corresponds to a falling edge of the digital clock signal, and a moment, at which the falling edge of the digital clock signal is present, is within a last line in one of a high-level period and a low-level period of a corresponding analog clock signal.

The control unit 511 is configured to control the current detection unit 512 to detect the current of the first analog clock signal.

The current detection unit 512 is configured to send an over-current signal to the over-current protection unit 514 when the current of the first analog clock signal is not within a current threshold range.

Here, the current of the first analog clock signal may refer to the current of the circuit where the first analog clock is present. In addition, the embodiment of the present disclosure does not limit the first analog clock signal to CLK1, and the first analog clock signal may be any one of the plurality of analog clock signals.

In summary, with the lift shift assembly according to the embodiment of the present disclosure, the controller determines, at the first falling edge of the digital clock signal, the first analog clock signal of a plurality of analog clock signals corresponding to the first falling edge based on the correspondence of the current display mode; the current detection unit is controlled to detect the current of the first analog clock signal; and since a moment, at which the falling edge of the digital clock signal is present, is at the last line in the corresponding analog clock signal during the high-level period or during the low-level period, and under normal circumstances, the current at the last line during the high-level period or during the low-level period should be zero, the current detection unit can then send the over-current signal to the over-current protection unit when the current of the first analog clock signal is not within the current threshold range. In this way, the problem of low accuracy of over-current detection in the related art is solved, and the effect of improving the accuracy of over-current detection is achieved.

In addition, when the CPV period, i.e., the line period, changes, the refresh rate changes accordingly. In an instance of the present disclosure, however, the correspondence between the falling edge of the digital clock signal and the analog clock signal does not change, the detection is still performed at the last line, and the detection effect does not change. That is, this solution is adapted for various situations where the refresh rate changes.

The current threshold range described above may be vary depending on the application scenario. For example, the current threshold range may be less than or equal to a specified value, which may be 30 mA to 200 mA.

The level shift assembly according to the embodiment of the present disclosure is applicable to various display modes, and in different display modes, different digital clock signals and different analog clock signals may be present in correspondence. In a case where the digital clock signal and analog clock signals are different, the correspondence between the falling edge of the digital clock signal and the corresponding analog clock signal of the plurality of analog clock signals is also different. But in general, a moment, at which the falling edge of the digital clock signal is present, is at the last line in the corresponding analog clock signal during the high-level period or during the low-level period. The correspondence in each case may be determined in advance based on the actual signal situation.

In an exemplary embodiment, the control unit 511 is configured to determine, among a plurality of preset display modes, a preset display mode matching the current display mode, and acquire the correspondence of the preset display mode matching the current display mode. The plurality of preset display modes each has the corresponding correspondence. For example, a first preset mode is to generate 8 analog clock signals CLKs from two digital clock signals CPV1 and CPV2, and CPV1 has the seventh falling edge corresponding to the detection for the low-level period of CLK8, and the eighth falling edge corresponding to the detection for the low-level period of CLK1; the second mode is to generate 10 analog clock signals from two digital clock signals, and CPV1 has the ninth falling edge corresponding to the detection for the low-level period of CLK10, and the tenth falling edge corresponding to the detection for the low-level period of CLK1, and so on; and in such way, the level shift assembly can be allowed to adapt to various display modes.

The level shift assembly shown in FIG. 6 includes a level shift unit 513, which may receive one digital clock signal and generate a plurality of analog clock signals based on the one digital clock signal. The display apparatus to which the lift shift assembly is applied includes one digital clock signal line. The control unit 511 has the number of one; and the control unit 511 is electrically connected to the one digital clock signal line.

For example, FIG. 7 is a schematic diagram of a digital clock signal and analog clock signals of the level shift assembly shown in FIG. 6. Referring to FIG. 7, the digital clock signal includes a first digital clock signal CPV1; the level shift unit 513 is configured to acquire, based on the first digital clock signal CPV1, a plurality of analog clock signals arranged sequentially; and for any two adjacent analog clock signals among the analog clock signals, a latter analog clock signal lags one line (set to the right by one CPV cycle in FIG. 7) behind a previous analog clock signal. FIG. 7 shows the case where the level shift unit generates 8 analog clock signals CLK1-CLK8 based on the first digital clock signal CPV1, which, however, is not limited in the embodiment of the present disclosure. FIG. 7 shows the case where one time-domain line is equal to two space-domain lines.

Specifically, the level shift unit may determine the rising edge and falling edge of each CLK based on each rising edge of the CPV.

In this case, the correspondence may include:

the first falling edge of CPV corresponding to CLK2;

the second falling edge of CPV corresponding to CLK3;

the third falling edge of CPV corresponding to CLK4 and CLK1;

the fourth falling edge of CPV corresponding to CLK5 and CLK2;

the fifth falling edge of CPV corresponding to CLK6 and CLK3;

the sixth falling edge of CPV corresponding to CLK7 and CLK4;

the seventh falling edge of CPV corresponding to CLK8 and CLK5;

the eighth falling edge of CPV corresponding to CLK1 and CLK6;

the ninth falling edge of CPV corresponding to CLK2 and CLK7;

the tenth falling edge of CPV corresponding to CLK3 and CLK8;

the eleventh falling edge of CPV corresponding to CLK4 and CLK1;

and so on in cycle.

Figure 8:
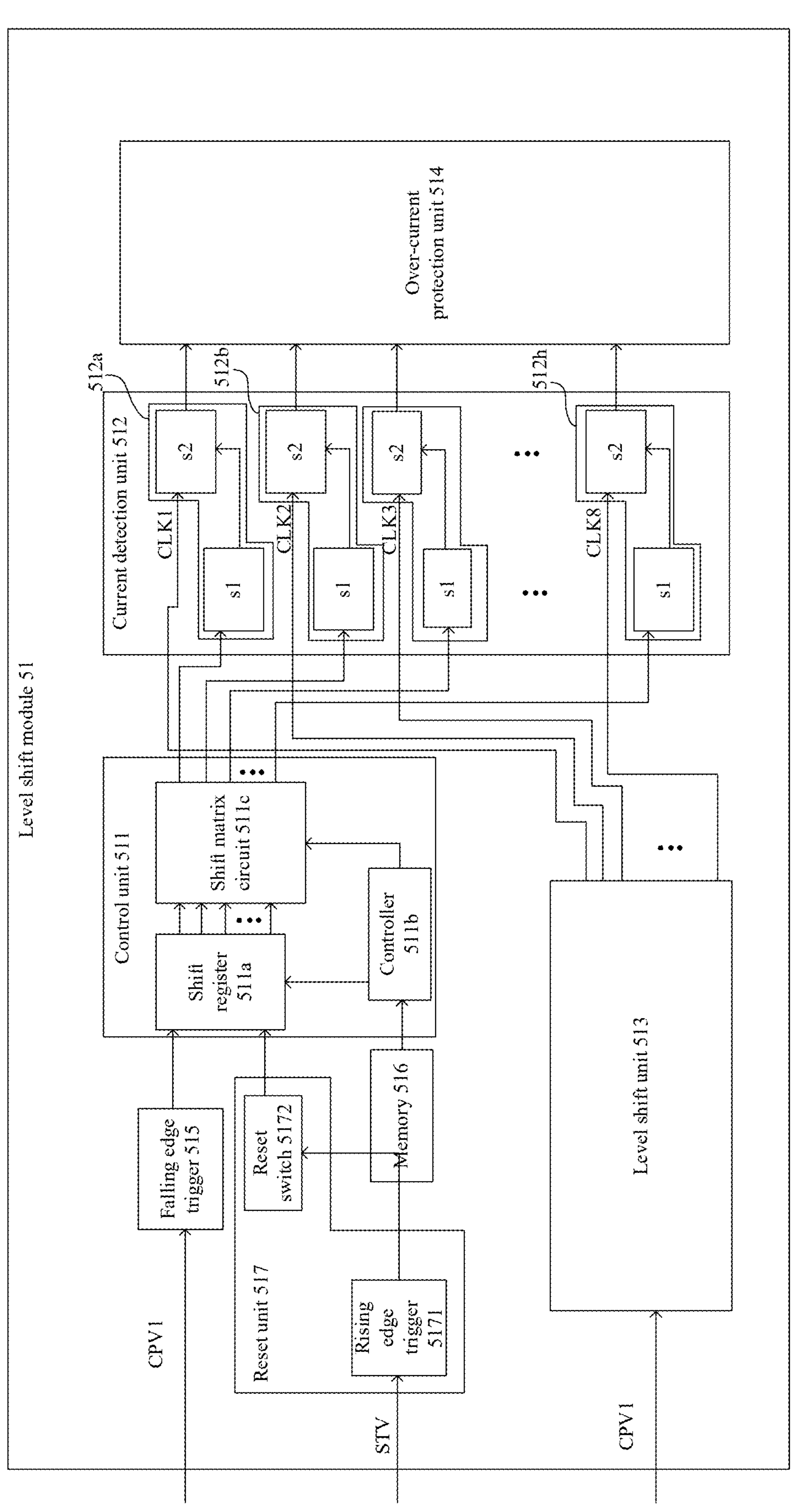
FIG. 8 is a schematic structural diagram of another level shift assembly according to an embodiment of the present disclosure.

FIG. 8 is a schematic structural diagram of another level shift assembly according to an embodiment of the present disclosure. The level shift module 51 further includes a falling edge trigger 515, which is configured to monitor the digital clock signal CPV and send a falling edge signal the control unit 511 when the falling edge of the digital clock signal CPV is detected.

The control unit 511 includes a shift register 511*a*, which is electrically connected to the falling edge trigger 515 and is configured to store the falling edge signal by bit. That is, a first falling edge signal is stored at a first bit, a second falling edge signal is stored at a second bit, till the eighth falling edge signal is stored at an eighth bit. Because the number of bits of the shift register is controlled by the controller 511*b*, the number of bits is the same as the number of analog clock signals CLK. Then, the ninth falling edge signal is stored at a first bit, and so on.

The control unit 511 further includes a shift matrix circuit 511*c*, which has one end electrically connected to the shift register 511*a*, and the other end electrically connected to the current detection unit 512.

The current detection unit 512 includes a plurality of current detection subunits (512*a*, 512*b*, 512*c* · · · ). The plurality of current detection subunits 5121 are configured to detect the currents of the plurality of analog clock signals, respectively. For example, the current detection subunit 512*a* is configured to detect the current of the analog clock signal CLK1, and the current detection subunit 521*b* is configured to detect the current of the analog clock signal CLK2.

The end of the shift matrix circuit 511*c* electrically connected to the shift register 511*a* may include a plurality of input channels, the sequence of which is the same as the sequence of bits of the shift register 511*a*. That is, the first bit of the shift register 511*a* corresponds to the first input channel of the shift matrix circuit 511*c*, and so on. The end of the shift matrix circuit 511*c* electrically connected to the current detection unit 512 may include a plurality of output channels, the sequence of which is the same as the sequence of the analog clock signals. That is, the first output channel is connected to the current detection subunit 512*a* corresponding to the analog clock signal CLK1, the second output channel is connected to the current detection subunit 512*b* corresponding to the analog clock signal CLK2, and so on.

The controller 511*b* is further configured to determine, among a plurality of preset display modes, a target display mode matching the current display mode. The plurality of preset display modes each has a corresponding correspondence, which may include connecting relationships between the plurality of input channels and the plurality of output channels of the shift matrix circuit 511*c*.

The controller 511*b* is also configured to control the shift matrix circuit 511*c* based on the correspondence corresponding to the target display mode. The shift matrix circuit 511*c* may modulate the correspondence between the input channels and the output channels. For example, in a type of correspondence, the first input channel is connected to the second output channel, the second input channel is connected to the third output channel, the third input channel is connected to the fourth output channel and the first output channel, the fourth output channel is connected to the fifth output channel and the second output channel, and so on.

With such a structure, when receiving a falling edge signal triggered by the first falling edge, the shift register 511*a* may be correspondingly electrically connected to the circuit for detecting CLK2, so as to detect the current of CLK2; and when receiving a falling edge signal triggered by the second falling edge, the shift register may be correspondingly electrically connected to the circuit for detecting CLK3, so as to detect the current of CLK3; and when receiving a falling edge signal triggered by the third falling edge, the shift register may be correspondingly electrically connected to the circuit for detecting CLK4 and CLK1, so as to detect the currents of CLK4 and CLK1.

The memory 516 is configured to store information such as the number of analog clock signals CLKs, the number of digital clock signals, and the high-level period of CLK. The memory 516 is electrically connected to the controller 511*b*, and the number of bits of the shift register 511*a* and the mode of the shift matrix circuit 511*c* are controlled by means of the controller 511*b*.

The controller 511*b* is configured to control the number of bits of the shift register and the preset mode of the shift matrix circuit 511*c*. For example, the controller 511*b* acquires clock signal data from the memory 516, and the clock signal data include the data of the plurality of analog clock signals and the data of the digital clock signal. For example, the clock signal data may include: the number of analog clock signal CLK is 8, the number of digital clock signal CPV is 1, and the high-level period of CLK is of 3 lines. Then, the controller 511*b* sets the number of bits of the shift register to 8 bits (the same as the number of CLK), and the preset mode of a shift matrix to mode 1. That is, the first falling edge of CPV corresponds to the detection for CLK2, the second falling edge of CPV corresponds to the detection for CLK3, and the third (the same as the number of lines at a high level) falling edge of CPV corresponding to the detection for CLK4 as well as for CLK1.

Without doubt, the level shift assembly according to the embodiment of the present disclosure may also achieve the effect of detecting the corresponding CLK based on the correspondence by means of some other structures, for example, by means of more complex circuits or control circuits, where are not limited in the embodiment of the present disclosure.

In an exemplary embodiment, each of the current detection subunits includes a switch unit s1 and a current detection unit s2. The switch unit s1 is electrically connected to the current detection unit s2, and is electrically connected to the shift matrix circuit 511C.

The shift register 511*a* is configured to send an switch-on signal to the shift matrix circuit 511*c* when receiving the falling edge signal, in order that the shift matrix circuit 511*c* transmits the switch-on signal to the switch unit s1 in the first current detection subunit 512*a*, and the switch unit s1 is configured to turn on the current detection unit s2 in the first current detection subunit 512*a*, so as to detected the current of the corresponding CLK.

It should be noted that the first falling edge may be any falling edge in the digital clock signal, and the embodiment of the present disclosure does not limit the first falling edge to the first one of the falling edges; and the first current detection subunit 512*a* is a current detection subunit for detecting the current of the corresponding analog clock signal corresponding to the first falling edge, and the embodiment of the present disclosure does not limit the first current detection subunit 512*a* to a current detection subunit for detecting CLK1.

Optionally, the display apparatus includes a frame start signal line STV, and the level shift module 51 further includes a reset unit 517, which is electrically connected to the frame start signal line STV and the shift register 511*a*, respectively.

The reset unit 517 is configured to reset the shift register 511*a* when receiving a frame start signal from the frame start signal line STV. At the beginning of each frame, the shift register 511*a* may be reset, such that the shift register 511*a* inputs from the first bit at the beginning of each frame.

Optionally, the reset unit 517 includes a rising edge trigger 5171 and a reset switch 5172. The rising edge trigger 5171 is electrically connected to the frame start signal line STV and the reset switch 5172, respectively, and the reset switch 5172 is electrically connected to the shift register 511*a*. The reset unit 517 may trigger a reset switch 5172 at the rising edge of a frame start signal, and the rising edge of the frame start signal is disposed before the first falling edge of the digital clock signal, in such a way that the correspondence between each falling edge of the digital clock signal and the current detection unit is the same in each frame.

Figure 9:
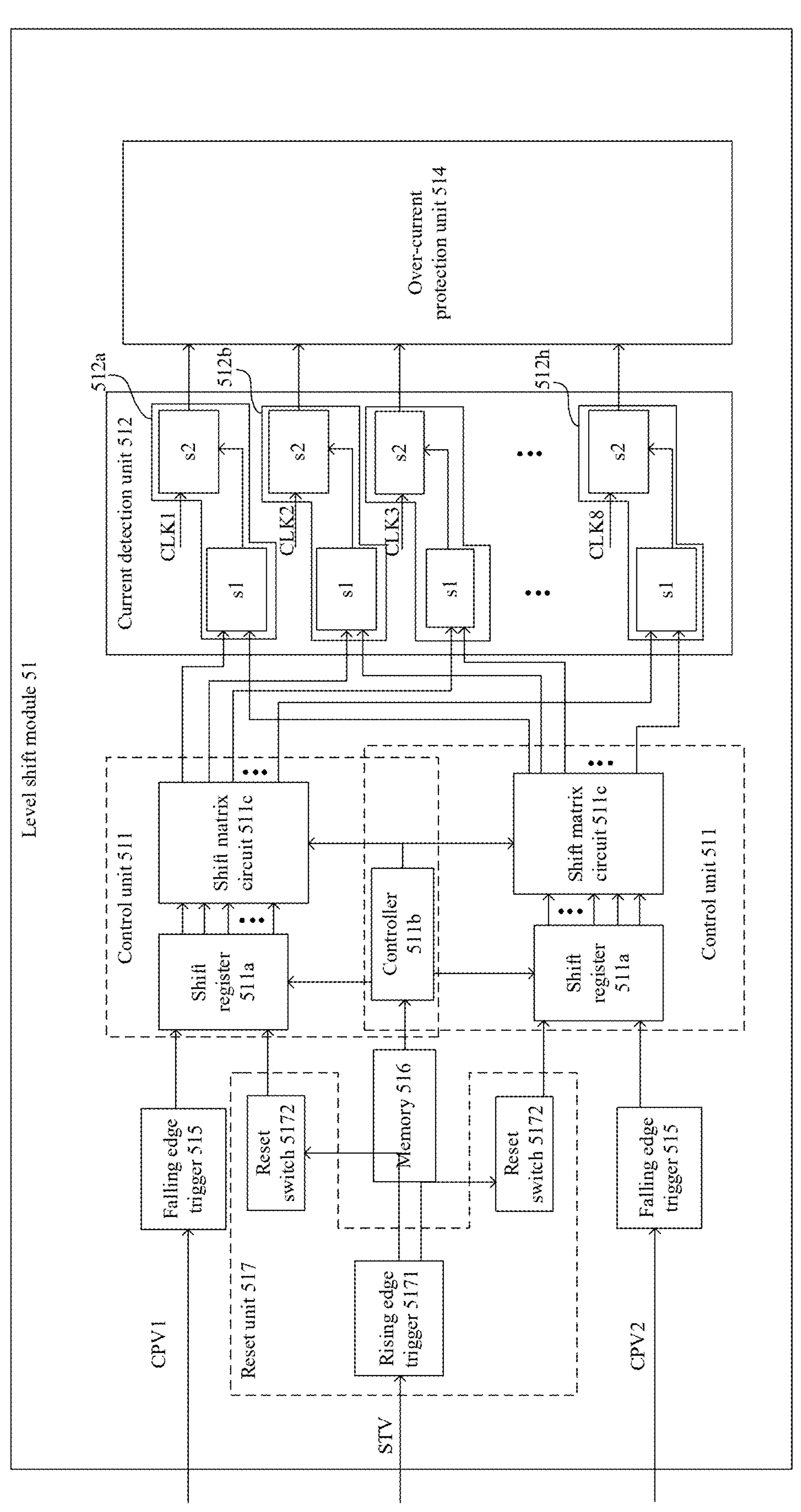
FIG. 9 is a schematic structural diagram of another level shift assembly according to an embodiment of the present disclosure.
Figure 10:
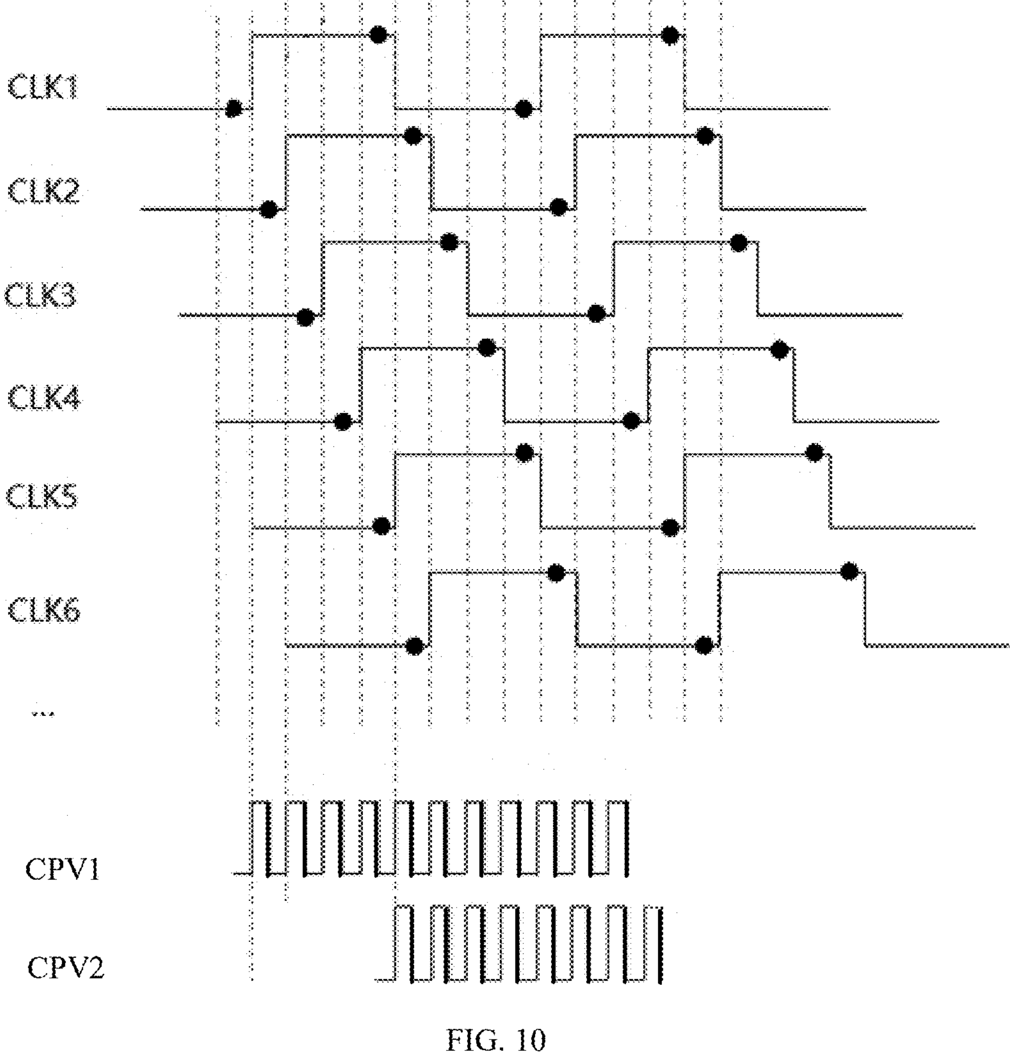
FIG. 10 is a schematic diagram of an analog clock signal and a digital clock signal for the level shift assembly shown in FIG. 9.

Without doubt, the level shift assembly according to the embodiment of the present disclosure may also have an additional structure. For example, referring to FIG. 9 and FIG. 10, FIG. 9 is a schematic structural diagram of another level shift assembly according to an embodiment of the present disclosure, and FIG. 10 is a schematic diagram of the analog clock signals and digital clock signals of the level shift assembly shown in FIG. 9. The digital clock signal includes a first digital clock signal CPV1 and a second digital clock signal CPV2; the level shift unit 513 is configured to acquire, based on the first digital clock signal CPV1 and the second digital clock signal CPV2, the plurality of analog clock signals CLK1, CLK2, CLK3 . . . arranged sequentially; and for any two adjacent analog clock signals among the analog clock signals, a latter analog clock signal lags one line behind a previous analog clock signal. FIG. 10 shows the case where one time-domain line is equal to one space-domain line.

Optionally, the display apparatus includes at least two digital clock signal lines (FIG. 9 shows the case of two digital clock signal lines, which, however, is not limited thereto, for example, the number of the digital clock signal lines may be 3, 4, 5, 6, or more); the number of the control unit 511 is at least two (FIG. 9 shows the case of two control unit 511, which, however, is not limited thereto, for example, the number of the control unit 511 may also be 3, 4, 5, 6 or more); and the at least two control units 511 are electrically connected to the at least two digital clock signal lines in one-to-one correspondence. The structure of each control unit 511 may be similar to the control unit 511 according to the embodiment described above. For example, each control unit 511 may include a shift register 511*a*, a controller 511*b*, and a shift matrix circuit 511*c*. In addition, the level shift assembly may include at least two falling edge triggers 515 in one-to-one correspondence to at least two control units 511. The falling edge triggers 515 may be electrically connected to the shift registers 511*a* in the corresponding control units 511, the shift registers 511*a* may be electrically connected to the shift matrix circuits 511*c*, and the controllers 511*b* may be electrically connected to the shift registers 511*a* and the shift matrix circuits 511*c*, respectively. The controllers 511*b* are configured to control the shift matrix circuits 511*c* to electrically connect, at the first falling edge, the shift registers to the first current detection subunit 512*a* of the plurality of current detection subunits; and the first current detection subunit 512*a* is configured to detect the current the first analog clock signal under the control of the shift registers 511*a* (the first analog clock signal may be any one of CLK1-CLK8, and FIG. 9 shows the case where the first analog clock signal is CLK1, which, however, is not limited thereto in the embodiment of the present disclosure). The shift matrix circuit 511*c* may electrically connect the shift registers 511*a* to a different current detection subunit under the control of the control units 511. The level shift assembly according to the embodiment of the present disclosure may also achieve the effect of detecting the corresponding CLK based on the correspondence by means of some other structures, for example, by means of more complex circuits or control circuits, where are not limited in the embodiment of the present disclosure.

A reference may also be made to the embodiments described above for the details of the shift register 511*a*, the controller 511*b*, and the shift matrix circuit 511*c*, which are not repeated here in the embodiment of the present disclosure.

In FIG. 9, the display apparatus includes a frame start signal line STV, and the level shift module 51 further includes a reset unit 517, which is electrically connected to the frame start signal line STV and the shift registers 511*a* in the two control units 511, respectively.

The reset unit 517 may be configured to reset the shift registers 511*a* in the two control units 511 when receiving a frame start signal from the frame start signal line STV. At the beginning of each frame, the shift register 511*a* may be reset, such that the shift register 511*a* inputs from the first bit at the beginning of each frame.

The reset unit 517 may include a rising edge trigger 5171 and two reset switches 5172; the rising edge trigger 5171 is electrically connected to the frame start signal line STV and the two reset switches 5172, respectively; and the two reset switches 5172 are electrically connected to the two shift registers 511*a* in the two control units 511, respectively. The reset unit 517 may trigger a reset switch 5172 at the rising edge of a frame start signal, and the rising edge of the frame start signal is disposed before the first falling edge of the digital clock signal, in such a way that the correspondence between each falling edge of the digital clock signal and the current detection unit is the same in each frame.

In addition, for clear illustration of other structures, the level shift unit is not shown in FIG. 9, which, however, is not limited thereto in the embodiment of the present disclosure.

As can be seen from FIG. 10, the falling edge of the first digital clock signal CPV1 corresponds to the current detection for the low-level period of CLK, and the falling edge of the second digital clock signal CPV2 corresponds to the current detection for the high-level period of CLK. Specifically, the correspondence may include:

- both the first falling edges of the first and second digital clock signals CPV1 and CPV2 corresponding to CLK2; and
- both the second falling edges of the first and second digital clock signals CPV1 and CPV2 corresponding to CLK3, and so on, until the eighth falling edge corresponding to CLK1, and so on in cycle.

It should be noted that although the first cycle of each frame of CLK1 cannot detect the current due to the lack of signals from CPV1 and CPV2, it may be detected from the second cycle, so it has no effect on the detection of over-current.

It should be noted that the controller 511*b* of a plurality of control units 511 may be shared, that is, a controller 511*b* may control the shift register 511*a* and the shift matrix circuit 511*c* in a plurality of control units 511, and this is the case shown in FIG. 9, of course, the shift register 511*a* and the shift matrix circuit 511*c* in different control units 511 may also be controlled by different controllers 511*b* respectively, and the embodiment of the present disclosure is not limited to this.

Figure 11:
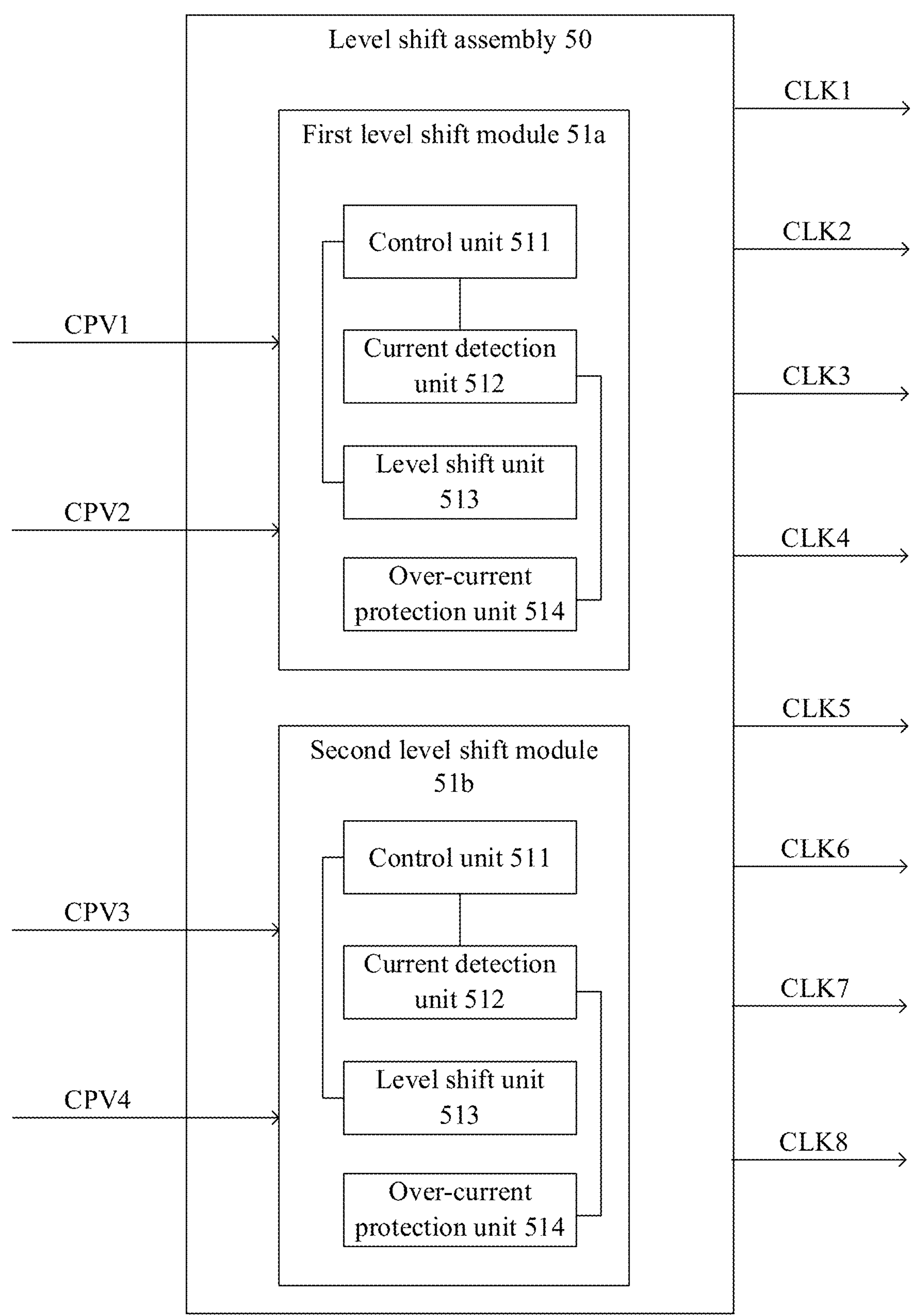
FIG. 11 is a schematic structural diagram of another level shift assembly according to an embodiment of the present disclosure.
Figure 12:
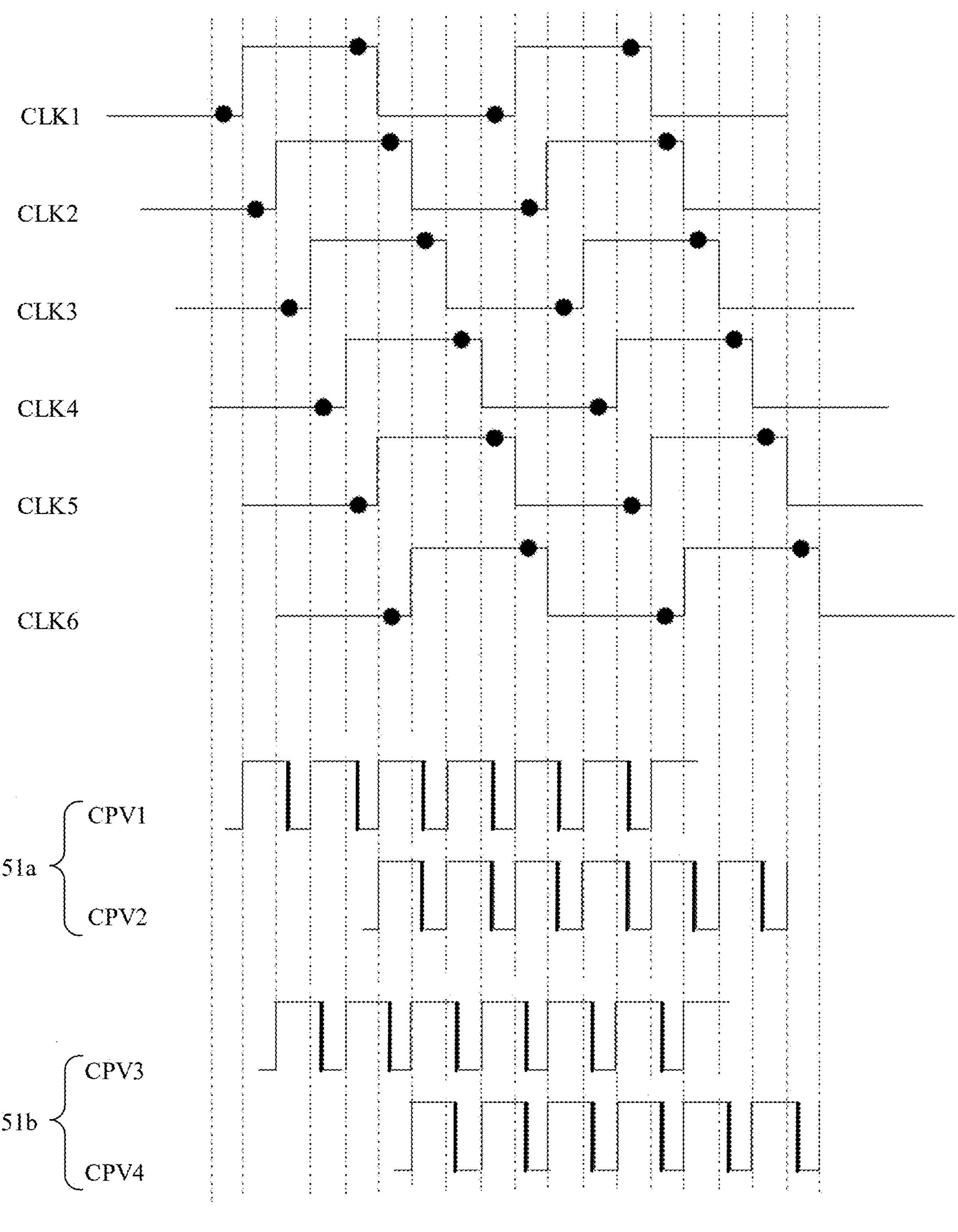
FIG. 12 is a schematic diagram of an analog clock signal and a digital clock signal for the level shift assembly shown in FIG. 11.

FIG. 11 is a schematic structural diagram of another level shift assembly according to an embodiment of the present disclosure, and FIG. 12 is a schematic diagram of the analog clock signals and digital clock signals of the level shift assembly shown in FIG. 11. Referring to FIG. 11 and FIG. 12, the level shift module has a number of 2, including a first level shift module 51 *a* and a second level shift module 51*b*, respectively. The first level shift module 51*a* and the second level shift module 51*b* are configured to jointly generate n analog clock signals, and for any two adjacent analog clock signals of the n analog clock signals, a latter analog clock signal lags one line behind a previous analog clock signal. A reference may be made to at least one of the plurality of level shift modules according to the embodiments described above for the structures of the first level shift module 51*a* and the second level shift module 51*b*, which are limited in the embodiment of the present disclosure.

The level shift unit 513 in the first level shift module 51*a* is configured to acquire a first digital clock signal CPV1 and a second digital clock signal CPV2, and generate odd-numbered analog clock signals among the n analog clock signals based on the first digital clock signal CPV1 and the second digital clock signal CPV2. The odd-numbered analog clock signal may refer to an analog clock signal with an odd serial number among the n analog clock signals, such as CLK1, CLK3 and CLK5 in FIG. 12.

The level shift unit 513 in the second level shift unit 51*b* is configured to acquire a third digital clock signal CPV3 and a fourth digital clock signal CPV4, and generates even-numbered analog clock signals among the n analog clock signals based on the third digital clock signal CPV3 and the fourth digital clock signal CPV4. The even-numbered analog clock signal may refer to an analog clock signal with an even serial number among the n analog clock signals, such as CLK2, CLK4 and CLK6 in FIG. 12.

The first digital clock signal CPV1, the second digital clock signal CPV2, the third digital clock signal CPV3, and the fourth digital clock signal CPV4 each have a duty cycle greater than 50%. This may allow a moment for current detection to be present at the last line of the CLK.

In addition, CPV3 described above may lag one line behind CPV1, CPV2 may lag 4 lines behind CPV1, and CPV4 may lag 4 lines behind CPV3. FIG. 12 shows the case where one space-domain line is equal to one time-domain line.

The correspondence may include:

CPV1 having a first falling edge corresponding to CLK3, a second falling edge corresponding to CLK5, a third falling edge corresponding to CLK7, a fourth falling edge corresponding to CLK1, a fifth falling edge corresponding to CLK3, and so on in cycle;

CPV2 having a first falling edge corresponding to CLK3, a second falling edge corresponding to CLK5, a third falling edge corresponding to CLK7, a fourth falling edge corresponding to CLK1, a fifth falling edge corresponding to CLK3, and so on in cycle;

CPV3 having a first falling edge corresponding to CLK4, a second falling edge corresponding to CLK6, a third falling edge corresponding to CLK8, a fourth falling edge corresponding to CLK2, a fifth falling edge corresponding to CLK4, and so on in cycle; and CPV4 having a first falling edge corresponding to CLK4, a second falling edge corresponding to CLK6, a third falling edge corresponding to CLK8, a fourth falling edge corresponding to CLK2, a fifth falling edge corresponding to CLK4, and so on in cycle.

Figure 13:
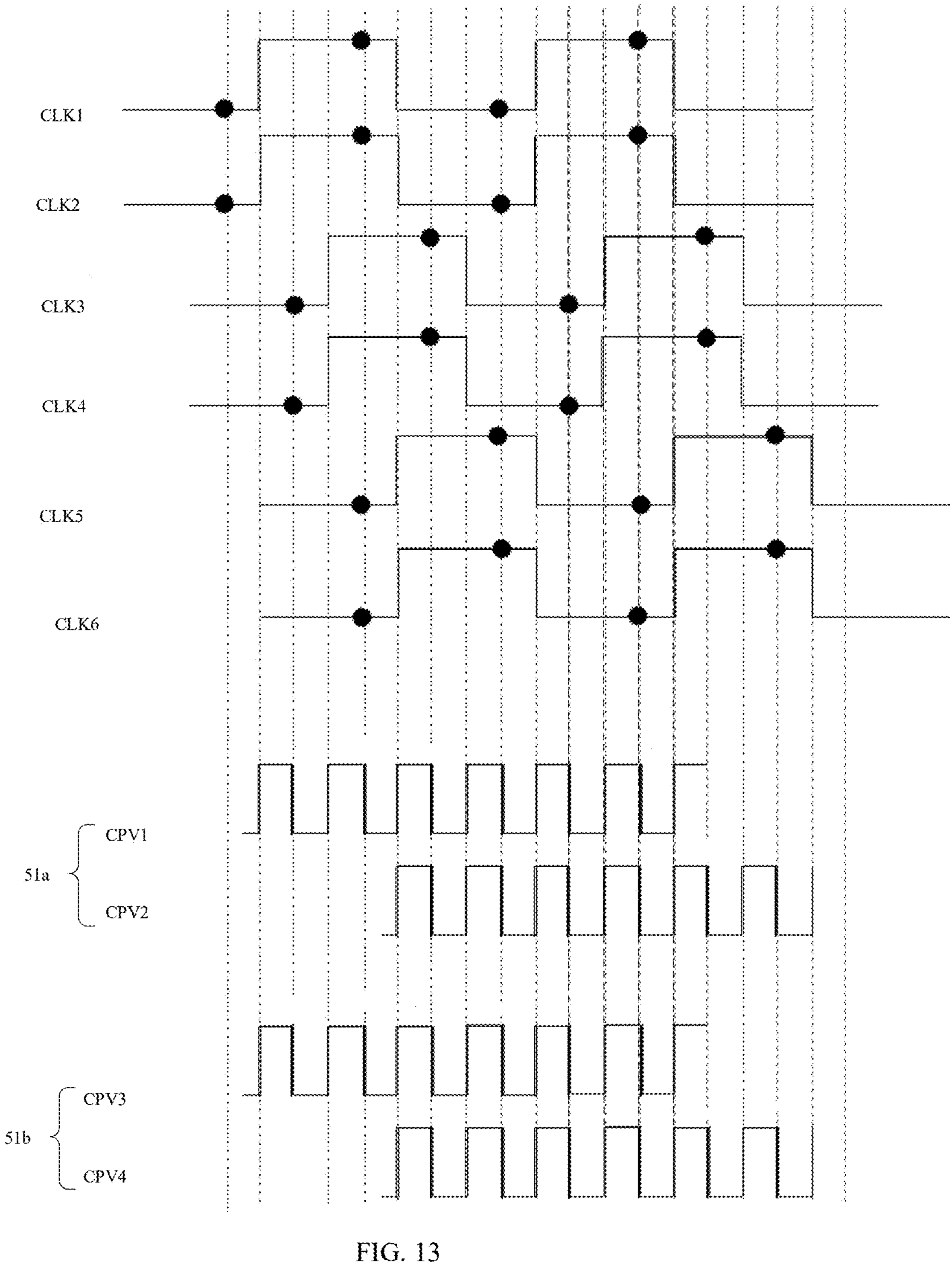
FIG. 13 is a schematic diagram of an analog clock signal and a digital clock signal for the level shift assembly shown in FIG. 11.

For the schematic diagram where the level shift assembly shown in FIG. 11 may also have additional analog clock signals and digital clock signals, for example, FIG. 13 is a schematic diagram of the analog clock signals and digital clock signals for the level shift assembly shown in FIG. 11. Referring to FIG. 11 and FIG. 13, the level shift module has a number of 2, including a first level shift module 51*a* and a second level shift module 51*b*, respectively. The first level shift module 51*a* and the second level shift module 51*b* are configured to jointly generate n analog clock signals, the n analog clock signals include a plurality of analog clock signal sets (in FIG. 13, CLK1 and CLK2 in a set, CLK3 and CLK4 in a set, and CLK5 and CLK6 in a set), each of which includes two adjacent analog clock signals; and for any two adjacent analog clock signal sets, a latter analog clock signal set lags one line behind a previous analog clock signal set. In FIG. 13, the adjacent analog clock signal sets are differed by two space-domain lines, and FIG. 13 shows the case where one time-domain line is equal to two space-domain lines.

The level shift unit 513 in the first level shift module 51*a* is configured to acquire a first digital clock signal CPV1 and a second digital clock signal CPV2, and generate odd-numbered analog clock signals among the n analog clock signals based on the first digital clock signal CPV1 and the second digital clock signal CPV2. The odd-numbered analog clock signal may refer to an analog clock signal with an odd serial number among the n analog clock signals, such as CLK1, CLK3 and CLK5 in FIG. 13.

The level shift unit 513 in the second level shift unit 51*b* is configured to acquire a third digital clock signal CPV3 and a fourth digital clock signal CPV4, and generates even-numbered analog clock signals among the n analog clock signals based on the third digital clock signal CPV3 and the fourth digital clock signal CPV4. The even-numbered analog clock signal may refer to an analog clock signal with an even serial number among the n analog clock signals, such as CLK2, CLK4 and CLK6 in FIG. 13.

The correspondence may include:

CPV1 having a first falling edge corresponding to CLK3, a second falling edge corresponding to CLK5, a third falling edge corresponding to CLK7, a fourth falling edge corresponding to CLK1, a fifth falling edge corresponding to CLK3, and so on in cycle; CPV2 having a first falling edge corresponding to CLK3, a second falling edge corresponding to CLK5, a third falling edge corresponding to CLK7, a fourth falling edge corresponding to CLK1, a fifth falling edge corresponding to CLK3, and so on in cycle; CPV3 having a first falling edge corresponding to CLK4, a second falling edge corresponding to CLK6, a third falling edge corresponding to CLK8, a fourth falling edge corresponding to CLK2, a fifth falling edge corresponding to CLK4, and so on in cycle; and CPV4 having a first falling edge corresponding to CLK4, a second falling edge corresponding to CLK6, a third falling edge corresponding to CLK8, a fourth falling edge corresponding to CLK2, a fifth falling edge corresponding to CLK4, and so on in cycle.

In an exemplary embodiment, the display apparatus includes a drive circuit, which is configured to acquire a plurality of analog clock signals output by the level shift unit and to drive, based on the plurality of analog clock signals, the display apparatus for displaying; and the over-current protection unit 514 is configured to determine, when the over-current signal is received, whether over-current occurs based on the over-current signal. The over-current protection unit 514 may have a variety of ways to determine whether over-current occurs, for example, to determine that the over-current has occurred, after a preset number of over-current signals are received, or after an over-current signal is received, or by referring to the related art, which is not limited in the embodiment of the present disclosure. After determining that the over-current has occurred, the over-current protection unit 514 may take over-current protection measures, which may include power-off, stopping operation, or various other measures, which are not limited in the embodiment of the present disclosure.

In summary, with the lift shift assembly according to the embodiment of the present disclosure, the controller determines, at the first falling edge of the digital clock signal, the first analog clock signal of a plurality of analog clock signals corresponding to the first falling edge based on the correspondence of the current display mode; the current detection unit is controlled to detect the current of the first analog clock signal; and since a moment, at which the falling edge of the digital clock signal is present, is at the last line in the corresponding analog clock signal during the high-level period or during the low-level period, and under normal circumstances, the current at the last line during the high-level period or during the low-level period should be zero, the current detection unit can then send the over-current signal to the over-current protection unit when the current of the first analog clock signal is not within the current threshold range. In this way, the problem of low accuracy of over-current detection in the related art is solved, and the effect of improving the accuracy of over-current detection is achieved.

Figure 14:
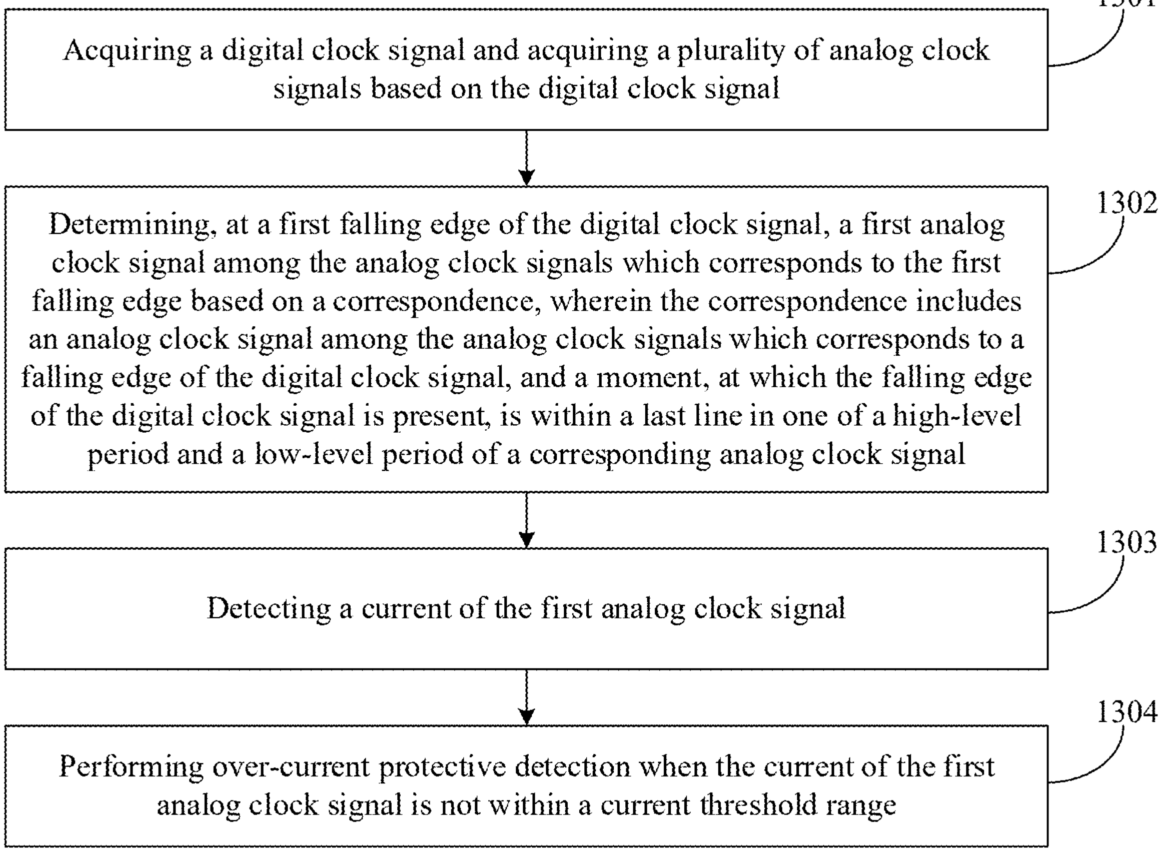
FIG. 14 is a flowchart of a method for over-current protection according to an embodiment of the present disclosure.

FIG. 14 is a flowchart of a method for over-current protection according to an embodiment of the present disclosure. The method is applicable to any one of the level shift assemblies according to the embodiments described above. The method may include the following steps.

In step 1301, a digital clock signal is acquired, and a plurality of analog clock signals is acquired based on the digital clock signal.

In step 1302, a first analog clock signal among the analog clock signals which corresponds to the first falling edge is determined at a first falling edge of the digital clock signal based on a correspondence. The correspondence includes an analog clock signal among the analog clock signals which corresponds to a falling edge of the digital clock signal, and a moment, at which the falling edge of the digital clock signal is present, is within a last line in one of a high-level period and a low-level period of a corresponding analog clock signal.

In step 1303, a current of the first analog clock signal is detected.

In step 1304, over-current protective detection is performed when the current of the first analog clock signal is not within a current threshold range.

In summary, with the method for over-current protection according to the embodiment of the present disclosure, the first analog clock signal of a plurality of analog clock signals corresponding to the first falling edge is determined at the first falling edge of the digital clock signal based on the correspondence of the current display mode; the current of the first analog clock signal is detected; and since a moment, at which the falling edge of the digital clock signal is present, is at the last line in the corresponding analog clock signal during the high-level period or during the low-level period, and under normal circumstances, the current at the last line during the high-level period or during the low-level period should be zero, the current detection unit can then send the over-current signal to the over-current protection unit when the current of the first analog clock signal is not within the current threshold range. In this way, the problem of low accuracy of over-current detection in the related art is solved, and the effect of improving the accuracy of over-current detection is achieved.

In an exemplary embodiment, the over-current protective detection performed in step 1304 above may include:

1. determining whether a preset number of analog clock signals having currents not within the current threshold range are present among the plurality of analog clock signals; and
2. determining that the over-current has occurred when a preset number of analog clock signals having currents not within the current threshold range are present among the plurality of analog clock signals.

This may avoid misjudgment when the current of an individual analog clock signal is not within the current threshold range, thereby improving the accuracy of over-current detection.

Figures 15, 16:
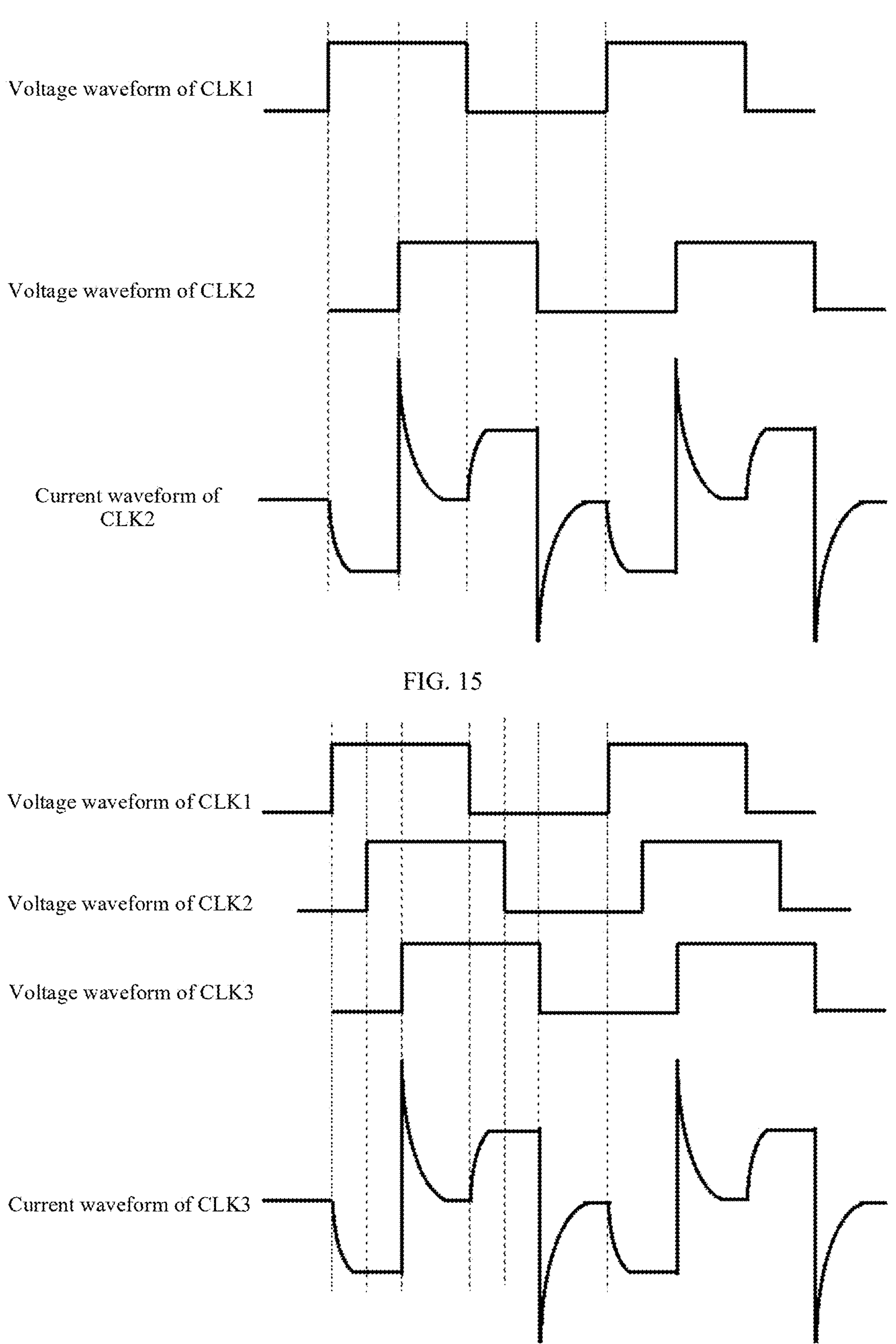
FIG. 15 is a diagram of waveforms arising from a short-circuit analog-digital signal line in a display apparatus.
FIG. 16 is a diagram of waveforms arising from another short-circuit analog-digital signal line in a display apparatus.

In addition, some application instances of the level shift assembly according to the embodiment of the present disclosure are illustrated. Referring to FIG. 15, it is a diagram of waveforms arising from a short-circuit analog-digital signal line in a display apparatus. The current waveform of CLK2 may be the current waveform generated when CLK2 and CLK1 are short-circuited. It can be seen that the current of CLK2 becomes larger at a moment of the last line of the high level and at a moment of the last line of the low level. That is, the current is no longer equal to zero. Then, by means of the level shift assembly according to the embodiment of the present disclosure, the current at the last line of CLK2 may be correspondingly detected to determine whether CLK1 and CLK2 are short-circuited.

Referring to FIG. 16, it is a diagram of waveforms arising from another short-circuit analog-digital signal line in a display apparatus. The current waveform of CLK3 may be the current waveform generated when CLK3 and CLK1 are short-circuited. It can be seen that the current of CLK3 becomes larger, due to short circuit, at a moment of the last two lines of the high level and at a moment of the last two lines of the low level. Then, the current CLK3 is no longer equal to zero at the last line during the high-level period or during the low-level period. By means of the level shift assembly according to the embodiment of the present disclosure, the current at the last line of CLK3 may be correspondingly detected to determine whether CLK1 and CLK3 are short-circuited.

Figure 17:
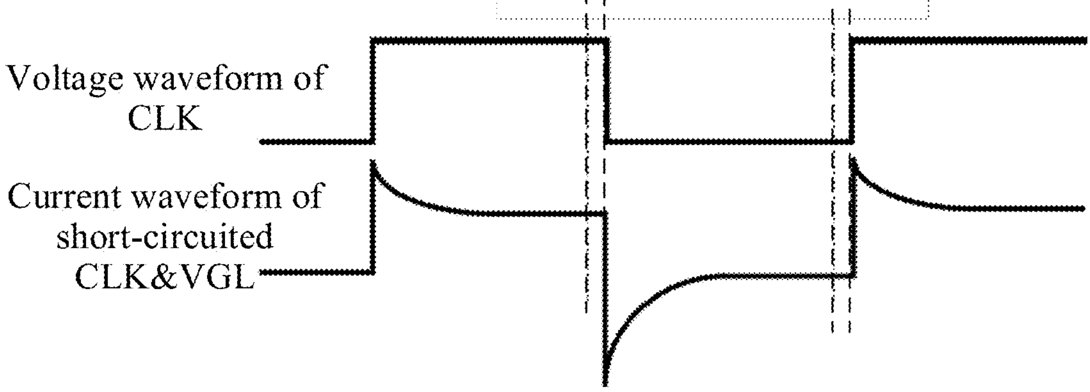
FIG. 17 is a diagram of waveforms arising from a short-circuit analog-digital signal line in a display apparatus.
Figure 17:
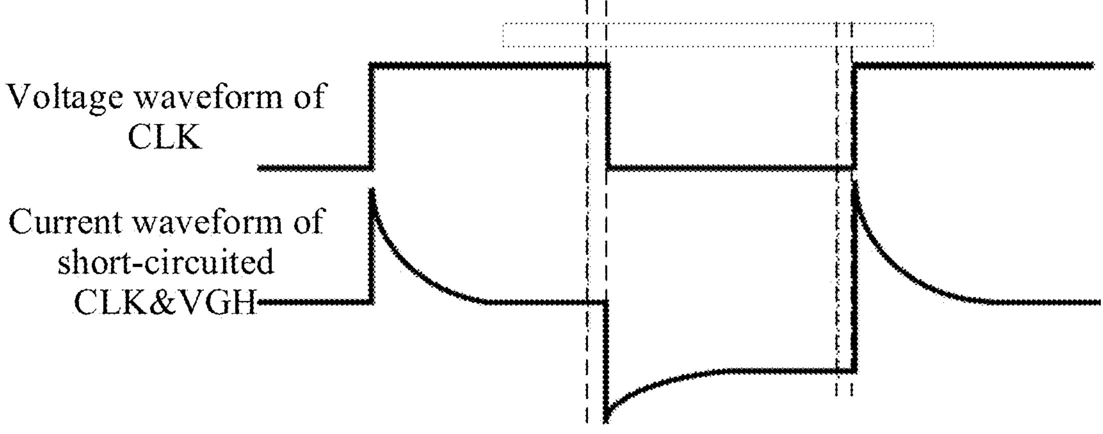

Referring to FIG. 17, it is a diagram of waveforms arising from another short-circuit analog-digital signal line in a display apparatus. FIG. 17 shows the current waveforms for short-circuited CLK and VGL (gate low level voltage), and the current waveforms for short-circuited CLK and VGH (Gate high level voltage). It can be seen that both the last line of the CLK during the high-level period and the last line of the CLK during the low-level period show a non-zero current. By means of the level shift assembly according to the embodiment of the present disclosure, the current at the last line of CLK may be correspondingly detected to determine whether CLK and VGH or VGL are short-circuited.

Figure 18:
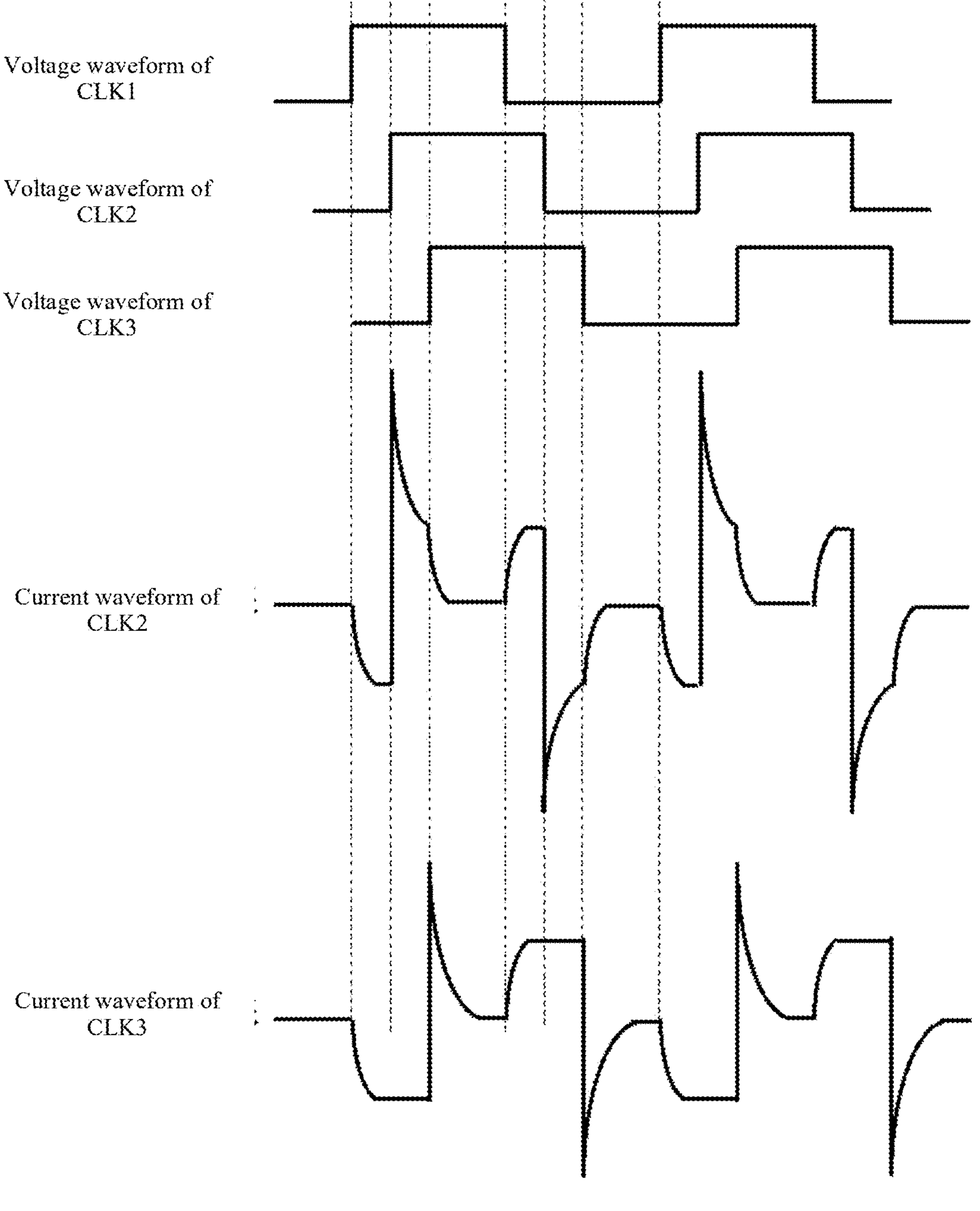
FIG. 18 is a diagram of waveforms arising from a short-circuit analog-digital signal line in a display apparatus.

Referring to FIG. 18, it is a diagram of waveforms arising from another short-circuit analog-digital signal line in a display apparatus. The current waveform of CLK2 may be the current waveform generated when CLK3, CLK2 and CLK1 are short-circuited, and the current waveform of CLK3 may be the current waveform generated when CLK3, CLK2 and CLK1 are short-circuited. It can be seen that the currents of CLK2 and CLK3 are not zero at the last line of CLK2 due to short circuit. By means of the level shift assembly according to the embodiment of the present disclosure, the current at the last line of each of CLK2 and CLK3 may be correspondingly detected to determine whether CLK2 and CLK3 are short-circuited.

In summary, the level shift assembly according to the embodiment of the present disclosure is applicable various situations to implement accurate over-current detection.

The term "at least one of A and B" in the present disclosure is merely to describe an association relationship between associated objects, indicating three possible types of relationships. For example, at least one of A and B may indicate the following three cases: A exists alone, A and B exist concurrently, or B exists alone. Likewise, "at least one of A, B, and C" indicates seven possible types of relationships, which may indicate the following seven cases: A exists alone, B exists alone, C exists alone, A and B exist concurrently, A and C exist concurrently, and C and B exist concurrently, and A, B and C exist concurrently. Likewise, "at least one of A, B, C, and D" indicates fifteen possible types of relationships, which may indicate the following fifteen cases: A exists alone, B exists alone, C exists alone, D exists alone, A and B exist concurrently, A and C exist concurrently, A and D exist concurrently, C and B exist concurrently, D and B exist concurrently, C and D exist concurrently, A, B and C exist concurrently, A, B and D exist concurrently, A, C and D exist concurrently, B, C, and D exist concurrently, and A, B, C, and D exist concurrently.

In the present disclosure, the terms "first", "second", "third" and "fourth" are for descriptive purposes only, and should not be construed as indicating or implying relative importance. The term "a plurality of" refers to two or more, unless otherwise specifically defined.

In the several embodiments provided by the present disclosure, it should be understood that the disclosed apparatus and method may be implemented in other manners. For example, the apparatus embodiments described above are merely schematic. For example, the division of a unit only indicates a logically functional division. There may be other divisions in actual implementation. For example, a plurality of units or components may be combined or may be integrated into another system, or some features may be ignored or not executed. For another point, the mutual coupling or direct coupling or communication connection as shown or discussed may be indirect coupling or communication connection via some interfaces, apparatuses or units, and may be in electrical, mechanical or other forms.

A unit described as a discrete component may be or may be not physically separated, and a component displayed as a unit may be or may be not a physical unit, and may be located at a place, or distributed over a plurality of network units. The objects of the solutions of the embodiments may be achieved by selecting some or all of the units according to actual needs.

Persons of ordinary skills in the art may understand that all or some of the steps described in the embodiments described above may be implemented by means of hardware, or by means of hardware instructed by a program stored in a computer-readable storage medium, which may be a read-only memory, a magnetic disk, or an optical disk, etc.

Described above are merely optional embodiments of the present disclosure, but are not intended to limit the present disclosure. Any modifications, equivalent replacements, improvements and the like made within the spirit and principles of the present disclosure should be included within the scope of protection of the present disclosure.

The invention claimed is:

1. A level shift assembly for use in a display apparatus, comprising a level shift module, wherein the level shift module comprises a control unit, a current detection unit, a level shift unit, and an over-current protection unit;

the level shift unit is configured to acquire a digital clock signal and acquire a plurality of analog clock signals based on the digital clock signal;

the control unit is configured to determine, at a first falling edge of the digital clock signal, a first analog clock signal among the analog clock signals which corresponds to the first falling edge based on a correspondence of a current display mode, wherein the correspondence is between falling edges of the digital clock signal and the analog clock signals, and a moment, at which the falling edge of the digital clock signal is present, is within a last line period of a plurality of sequential line periods of one of a high-level period and a low-level period of a corresponding analog clock signal;

the control unit is configured to control the current detection unit to detect a current of the first analog clock signal; and the current detection unit is configured to send an over-current detection signal to the over-current protection unit when the current of the first analog clock signal is not within a current threshold range.

2. The level shift assembly according to claim 1, wherein the level shift module further comprises a falling edge trigger, which is configured to monitor the digital clock signal and send a falling edge detection signal to the control unit when a falling edge of the digital clock signal is detected.

3. The level shift assembly according to claim 2, wherein the control unit comprises a shift register, which is electrically connected to the falling edge trigger and is configured to control, under trigger of the falling edge detection signal and based on the correspondence between falling edges of the digital clock signal and the analog clock signals, the current detection unit to detect a current of the analog clock signal corresponding to the falling edge.

4. The level shift assembly according to claim 3, wherein the control unit further comprises a controller and a shift matrix circuit electrically which is connected to the shift matrix circuit;

the shift matrix circuit is electrically connected to the shift register and the current detection unit, respectively;

the current detection unit comprises a plurality of current detection subunits, which are configured to detect currents of the plurality of analog clock signals, respectively; and the controller is configured to control the shift matrix circuit to switch on a connection between the shift register and a first current detection subunit among the current detection subunits at the first falling edge, and the first current detection subunit is configured to detect the current of the first analog clock signal under control of the shift register.

5. The level shift assembly of claim 4, wherein each of the current detection subunits comprises a switch sub-subunit and a current detection sub-subunit, and the switch sub-subunit is electrically connected to the current detection sub-subunit and is electrically connected to the shift matrix circuit; and the shift register is configured to send an switch-on signal to the shift matrix circuit when receiving the falling edge detection signal, in order that the shift matrix circuit transmits the switch-on signal to a switch unit in the first current detection subunit, and the switch sub-subunit is configured to turn on a current detection sub-subunit in the first current detection subunit.

6. The level shift assembly according to claim 4, wherein the level shift module further comprises a memory, clock signal data being stored in the memory; the clock signal data comprise data of the plurality of analog clock signals and data of the digital clock signal; the memory is electrically connected to the controller; the controller is configured to control the shift matrix circuit based on the clock signal data, such that the shift matrix circuit switch on the connection between the shift register and the first current detection subunit among the current detection subunits at the first falling edge.

7. The level shift assembly according to claim 6, wherein the clock signal data comprise a number of cycles of the analog clock signals, and the controller is configured to control the shift register based on the number of cycles of the analog clock signals, such that a number of bits of the shift register is the same as the number of cycles of the analog clock signals.

8. The level shift assembly according to claim 6, wherein the shift matrix circuit comprises a plurality of input channels and a plurality of output channels, the plurality of input channels being electrically connected to the shift register, and the plurality of output channels being electrically connected to the plurality of current detection subunits;

the controller is further configured to determine, among a plurality of preset display modes, a target display mode matching the current display mode, the plurality of preset display modes each having a corresponding correspondence, which comprises connecting relationships between the plurality of input channels and the plurality of output channels; and the controller is further configured to control the shift matrix circuit based on a corresponding correspondence of the target display mode.

9. The level shift assembly according to claim 3, wherein the display apparatus comprises a frame start signal line, and the level shift module further comprises a reset unit, which is electrically connected to the frame start signal line and the shift register, respectively; and the reset unit is configured to reset the shift register when receiving a frame start signal from the frame start signal line.

10. The level shift assembly according to claim 9, wherein the reset unit comprises a rising edge trigger and a reset switch; the rising edge trigger is electrically connected to the frame start signal line and the reset switch, respectively, and the reset switch is electrically connected to the shift register.

11. The level shift assembly according to claim 1, wherein the display apparatus comprises at least two digital clock signal lines; the control unit has a number of at least two; and the at least two control units are electrically connected to the at least two digital clock signal lines in one-to-one correspondence.

12. The level shift assembly according to claim 1, wherein the display apparatus comprises one digital clock signal line; the control unit has a number of one; and the control unit is electrically connected to the one digital clock signal line.

13. The level shift assembly according to claim 1, wherein the digital clock signal comprises a first digital clock signal and a second digital clock signal; the level shift unit is configured to acquire, based on the first digital clock signal and the second digital clock signal, the plurality of analog clock signals arranged sequentially; and for any two adjacent analog clock signals among the analog clock signals, a latter analog clock signal lags one line period behind a previous analog clock signal.

14. The level shift assembly according to claim 1, wherein the level shift module has a number of 2, the two level shift modules comprising a first level shift module and a second level shift module, the first level shift module and the second level shift module are configured to jointly generate n analog clock signals, and for any two adjacent analog clock signals of the n analog clock signals, a latter analog clock signal lags one line period behind a previous analog clock signal;

a level shift unit in the first level shift module is configured to acquire a first digital clock signal and a second digital clock signal, and generates odd-numbered analog clock signals among the n analog clock signals based on the first digital clock signal and the second digital clock signal;

a level shift unit in the second level shift unit is configured to acquire a third digital clock signal and a fourth digital clock signal, and generates even-numbered analog clock signals among the n analog clock signals based on the third digital clock signal and the fourth digital clock signal; and the first digital clock signal, the second digital clock signal, the third digital clock signal and the fourth digital clock signal each have a duty cycle greater than 50%.

15. The level shift assembly according to claim 1, wherein the level shift module has a number of 2, the two level shift modules comprising a first level shift module and a second level shift module, the first level shift module and the second level shift module are configured to jointly generate n analog clock signals, the n analog clock signals comprise a plurality of analog clock signal sets, each of which comprises two adjacent analog clock signals, and for any two adjacent analog clock signal sets, a latter analog clock signal set lags one line period behind a previous analog clock signal set;

a level shift unit in the first level shift module is configured to acquire a first digital clock signal and a second digital clock signal, and generate odd-numbered analog clock signals among the n analog clock signals based on the first digital clock signal and the second digital clock signal; and a level shift unit in the second level shift module is configured to acquire a third digital clock signal and a fourth digital clock signal, and generate even-numbered analog clock signals among the n analog clock signals based on the third digital clock signal and the fourth digital clock signal.

16. The level shift assembly according to claim 1, wherein the digital clock signal comprises a first digital clock signal; the level shift unit is configured to acquire, based on the first digital clock signal, the plurality of analog clock signals arranged sequentially; and for any two adjacent analog clock signals among the analog clock signals, a latter analog clock signal lags one line period behind a previous analog clock signal.

17. The level shift assembly according to claim 1, wherein the display apparatus comprises a drive circuit, which is configured to acquire the plurality of analog clock signals output by the level shift unit and to drive, based on the plurality of analog clock signals, the display apparatus to display; and the over-current protection unit is configured to determine, when the over-current detection signal is received, whether over-current occurs based on the over-current detection signal.

18. A method for over-current protection for use in the lift shift assembly according to claim 1, comprising:

acquiring a digital clock signal, and acquiring a plurality of analog clock signals based on the digital clock signal;

determining, at a first falling edge of the digital clock signal, a first analog clock signal among the analog clock signals which corresponds to the first falling edge based on a correspondence, wherein the correspondence is between falling edges of the digital clock signal and the analog clock signals, and a moment, at which the falling edge of the digital clock signal is present, is within a last line period of a plurality of sequential line periods of one of a high-level period and a low-level period of a corresponding analog clock signal;

detecting a current of the first analog clock signal; and performing over-current protective detection when the current of the first analog clock signal is not within a current threshold range.

19. The display apparatus, comprising a display panel and the level shift assembly according to claim 1.

20. The display apparatus according to claim 19, further comprising a timing controller and a drive circuit, wherein the level shift assembly is electrically connected to the timing controller and the drive circuit, respectively; the timing controller is configured to provide a digital clock signal to the level shift assembly; and the drive circuit is configured to drive the display panel based on analog clock signals provided by the level shift assembly.

* * * * *